(12) United States Patent
Or-Bach et al.

(10) Patent No.: US 6,953,956 B2
(45) Date of Patent: Oct. 11, 2005

(54) SEMICONDUCTOR DEVICE HAVING BORDERLESS LOGIC ARRAY AND FLEXIBLE I/O

(75) Inventors: Zvi Or-Bach, San Jose, CA (US); Laurance Cooke, Los Gatos, CA (US)

(73) Assignee: eASIC Corporation, San Jose, CA (US)

( * ) Notice: Subject to any disclaimer, the term of this patent is extended or adjusted under 35 U.S.C. 154(b) by 67 days.

(21) Appl. No.: 10/321,669

(22) Filed: Dec. 18, 2002

(65) Prior Publication Data

US 2004/0119098 A1 Jun. 24, 2004

(51) Int. Cl.⁷ .......................... H01L 27/10; H01L 23/48
(52) U.S. Cl. ...................... 257/203; 257/620; 257/734; 257/773
(58) Field of Search .................. 257/202, 203, 257/620, 734, 773, 786

(56) References Cited

U.S. PATENT DOCUMENTS

| | | | |
|---|---|---|---|
| 3,401,126 A | 9/1968 | Miller et al. | |
| 3,429,040 A | 2/1969 | Miller | |
| 4,545,610 A | 10/1985 | Lakritz | |
| 4,733,288 A | 3/1988 | Sato | |
| 4,937,475 A | * 6/1990 | Rhodes et al. | 326/41 |
| 5,016,080 A | 5/1991 | Giannella | |
| 5,217,916 A | 6/1993 | Anderson et al. | |
| 5,650,348 A | 7/1997 | Pasch | |
| 5,656,851 A | 8/1997 | Hamilton et al. | |
| 5,721,151 A | 2/1998 | Padmanabhan et al. | |
| 5,801,406 A | 9/1998 | Lubow et al. | |
| 5,994,766 A | * 11/1999 | Shenoy et al. | 257/659 |
| 6,184,711 B1 | * 2/2001 | Graef et al. | 326/41 |
| 6,194,912 B1 | 2/2001 | Or-Bach | |
| 6,236,229 B1 | 5/2001 | Or-Bach | |
| 6,245,634 B1 | 6/2001 | Or-Bach | |
| 6,316,334 B1 | * 11/2001 | Sivilotti et al. | 438/462 |
| 6,331,733 B1 | 12/2001 | Or-Bach et al. | |
| 6,331,789 B2 | 12/2001 | Or-Bach | |
| 6,331,790 B1 | 12/2001 | Or-Bach et al. | |
| 6,356,958 B1 | * 3/2002 | Lin | 710/1 |
| 6,403,448 B1 | 6/2002 | Reddy | |
| 6,476,493 B2 | 11/2002 | Or-Bach et al. | |
| 6,671,865 B1 | * 12/2003 | Ali et al. | 716/8 |

\* cited by examiner

Primary Examiner—T. N. Quach
(74) Attorney, Agent, or Firm—Venable LLP; Jeffrey W. Gluck

(57) ABSTRACT

A novel method is presented to provide ASICs with drastically reduced NRE and with volume flexibility. The invention includes a method of fabricating an integrated circuit, including the steps of: providing a semiconductor substrate, forming a borderless logic array including a plurality of Area I/Os and also including the step of forming redistribution layer for redistribution at least some of the Area I/Os for the purpose of the device packaging. The fabrication may utilize Direct Write e-Beam for customization. The customization step may include fabricating various types of devices at different volume from the same wafer.

15 Claims, 26 Drawing Sheets

SEMICONDUCTOR DEVICE HAVING BORDERLESS LOGIC ARRAY AND FLEXIBLE I/O

BACKGROUND OF THE INVENTION

1. Field of the Invention

The present invention relates to logic arrays and fabrication method for custom integrated circuit 2. Discussion of Background Art Semiconductor manufacturing is known to improve device density in exponential manner over time, but such improvements do come with a price. The cost of mask set required for each new process technology has been increasing exponentially. In addition, the minimum fabrication quantity due to the increases of wafer size has also increased exponentially at the same time.

These changes represent an increasing challenge primarily to custom products, which tend to target smaller volume and less diverse markets therefore making the increased cost of product development and reduction of manufacturing flexibility very hard to accommodate.

Custom Integrated Circuits can be segmented into two groups. The first group includes devices that have all their layers custom made. The second group includes devices that have at least some generic layers used across different custom products. Well known examples of the second kind are Gate Arrays, which use generic layers for all layers up to contact layer, and FPGAs which utilize generic layers for all their layers. This second group of custom integrated circuits is also sometimes called semi-custom devices due to their broader applicability. The generic layers in such devices are mostly a repeating pattern structure in array form.

The use of generic layers across multiple application provides saving for the individual custom product with respect to the cost of masks and economies of scale. In 1996 Chip Express of Santa Clara, Calif., introduced a logic array called CX2000 that utilized a base logic cell equivalent to about 4 logic gates. At a later time Lightspeed Semiconductor of Sunnyvale, Calif., introduced their 3G Modular Array product family. These more advanced logic arrays use generic layers, comprising mostly repeating pattern, also for some of the metal layers such as contact, Metal-1, Via-1 and Metal-2. These types of logic arrays are sometime called Module Arrays and require less custom layers. A very advanced Module Array technology was introduced by eASIC of San Jose, Calif., in September 2000.

That Module Arrays uses generic layers such as Metal-1 and Metal-2 to define the logic array, in conjunction with generic layers such as Metal-3 and Metal-4 to provide a generic connectivity fabric. The generic connectivity fabric comprises of repeating patterns that are also structured in array form. Such arrangement allows to further reduce the number of custom layers required for design customization. eASIC technology, as described in U.S. Pat. No. 6,331,790 is going further toward the goal minimizing the number of custom masks and requires only a single custom via mask.

The logic array technology is based on a generic fabric that is customized for a specific design during the customization stage. As designs tend to be highly variable in the amount of logic and memory each one needs, vendors of logic array create product families with a number of Master Slices covering a range of logic and memory size options. Yet, it is always a challenge to come up with minimum set of Master Slices that will provide a good fit for maximal number of designs.

U.S. Pat. No. 4,733,288 issued to Sato Shinji Sato in March 1988, discloses a method "to provide a gate-array LSI chip which can be cut into a plurality of chips, each of the chips having a desired size and a desired number of gates in accordance with a circuit design." The prior art in the references cited presents few alternative methods to utilize generic structure for a different size of custom devices.

The array structure fits the objective of variable sizing. The difficulty to provide variable-sized devices is due to the need of providing I/O cells and associated pads to connect the device to the package.

U.S. Pat. No. 5,217,916 issued to Anderson et al. on Jun. 8, 1993, discloses a configurable gate array free of predefined boundaries-borderless-using transistor gate cells, of the same type of cells used for logic, to serve the input and output function. Accordingly, the input and output functions may be placed to surround the logic array sized for the specific application. This method presents a severe limitation on the I/O cell to use the same transistors as used for the logic and would not allow the use of higher operating voltage for the I/O.

It is also known in the art that I/O and pads do not need to be at the edge of the semiconductor device. Semiconductor devices could be using the flip chip or C-4 (controlled collapse chip connection) technology described in U.S. Pat. No. 3,401,126 and 3,429,040 by Miller that had been used for over 30 years in IBM's mainframe computer modules. In these approaches the bonding pads are deployed in an area array over the surface of the chip known as area bonding and may use I/O cells known as area I/O placed near the area pads. Flip Chip packaging is known in the art to use an additional final metal layer known as the redistribution layer, to allow proper distribution of the device I/O to the area pads.

SUMMARY OF THE INVENTION

The present invention seeks to provide a new method for semiconductor device fabrication that is highly desirable for custom products. The current invention suggests the use of direct-write e-Beam in conjunction with a continuous logic array. The continuous array utilizes area I/O with area pads to allow variable sizing of designs and placing them on a wafer with various numbers of repetitions. The current invention provides solution to the challenge of high cost of mask-set and low flexibility that exist in the currently-common methods of semiconductor fabrication. An additional advantage of the invention is that it reduces the high cost of manufacturing the many different mask sets required in order to provide acceptable range of master slices. The current invention improves upon the prior art in many respects, including the way the semiconductor device is structured and those related to methods of fabrication of semiconductor devices.

The prior art reflected the motivation to better fit the device size to the custom application and therefore saving on wasted silicon. The current invention reflects the motivation to save on the cost of masks with respect to the investment that would have been otherwise required to put in place proper set of master slices. The current invention also seeks to provide the ability to incorporate memory blocks in the custom device. The current invention provides a method to customize the device with respect the amount of logic and memory required.

The main point of the current invention is the use of area I/O to provide a continuous fabric that provides a continuous terrain of logic and I/O and also provides the ability to mix-in continuous terrain of memory with islands of special functions like PLL and SERDES. The current invention shows that with area I/O and redistribution layer to connect the area I/O to area pads, many of the limitation of the prior art are overcome. A greater level of flexibility is therefore provided. The current invention also suggests to utilize Module Array, whereby additional layers such as Metal-1 and Metal-2 are generic and would be part of such borderless continuous terrain. Furthermore, the current invention also suggests the use of segmented routing whereby some of the connectivity layers are also generic and would be a part of the continuous terrain. In such fabric only few layers need to be customized while most of the layers are generic and consist primarily of a repeating pattern. A favorable embodiment of the current invention is a continuous terrain customizable by single custom via layer. Furthermore, the current invention suggests the use of direct-write e-Beam for those few custom layers. An added advantage of the current invention is the use of direct-write e-Beam on the continuous terrain to provide on the same wafer different product types, with different amount of product units of the various product types. The very large size of current wafer allows hundreds of device units, each of different type, built on a single wafer. Therefore the current invention allows to provide "on-demand" semiconductor device manufacturing, where one customers could get few units of one type of device for prototype work, while another may get few hundreds of devices for low volume production, all from a single wafer fabrication process.

To allow such level of flexibility with borderless terrain, the current invention suggests wafer level customization using equipment like direct-write e-Beam and dicing the wafer using highly flexible dicing using equipment like laser-based dicing. Such equipment allows mix and match of various die sizes on the wafer, as opposed to the saw dicing commonly used in the industry, which requires dicing along complete straight lines from one wafer edge to the other. An added advantage of the current invention's is the use of area pads and homogenous pad terrain so single probe card could be use for various devices.

The present invention also seeks to provide an improved semiconductor device including borderless logic array; area I/Os; and a redistribution layer for redistributing at least some of the area I/Os.

Preferably some of the pads are used to connect the semiconductor device to other devices and overlays at least a portion of the logic array or a portion of the area I/Os.

Preferably the semiconductor device also includes a borderless memory array. Preferably the logic array includes a module array. Preferably the logic array includes interconnections within the logic array, wherein the logic array interconnections include metal layers and via layers, and wherein at least one of the metal layers includes at least one substantially repeating pattern for a portion used for the interconnections. And according to one embodiment of the invention, the logic array interconnection includes at least two of metal layers with substantially repeating patterns for portions used for interconnections. And according to another embodiment of the invention, the logic array interconnection includes at least three metal layers with substantially repeating patterns for portions used for the interconnections. Preferably the area I/Os are positioned in a non-surrounding fashion with respect to the logic array. Preferably, the logic array includes a repeating module, and wherein the area I/Os are positioned in a non-surrounding fashion with respect to at least one of the repeating module. Preferably at least one of the area I/Os is a configurable I/O.

There is thus provided in accordance with a preferred embodiment of the invention, a method of fabricating a semiconductor device, comprising the steps of: providing a semiconductor substrate; forming a borderless logic array, including a plurality of area I/Os, on the semiconductor substrate; and forming a redistribution layer for redistributing at least some of the area I/Os.

Preferably also including the step of: forming pads to connect the semiconductor device to other devices, and wherein at least one of the pads overlays at least a portion of the logic array or a portion of the area I/Os.

Preferably also including the steps of: placing and routing a specific design on the logic array; and marking marks for an edge of a used portion of the logic array according to the step of placing and routing.

Preferably the step of marking comprises photolithography, and also including a step of dicing the semiconductor substrate according to the marks.

Preferably the step of dicing includes laser dicing.

There is thus provided in accordance with another preferred embodiment of the invention, a method of fabricating an integrated circuit, comprising the step of: Providing a semiconductor substrate, forming a borderless logic array including a memory array, a plurality of area I/Os and also including the step of forming redistribution layer for redistribution at least some of the area I/Os for the purpose of the device packaging.

Preferably also including the steps of: placing and routing a specific design on the logic array and the memory array; and marking marks for an edge of a used portion of the logic array and the memory array according to the step of placing and routing.

Preferably the step of marking, includes photolithography, and also including a dicing the semiconductor substrate according to the marks.

Preferably the step of dicing includes laser dicing.

There is thus provided in accordance with another preferred embodiment of the invention, a method of fabricating an integrated circuit, comprising the step of: providing a semiconductor substrate, forming a borderless logic array including, a plurality of area I/Os and also including the step of forming redistribution layer for redistribution at least some of the area I/Os for the purpose of the device packaging and wherein the logic array includes a module array.

There is thus provided in accordance with another preferred embodiment of the invention, a method of fabricating an integrated circuit, comprising the step of: Providing a semiconductor substrate, forming a borderless logic array including a plurality of area I/Os and also including the step of forming redistribution layer for redistribution at least some of the area I/Os for the purpose of the device packaging, and wherein the logic array is interconnected by metal layers and via layers, and wherein at least one of the metal layers comprises at least one substantially repeating pattern for a portion used for interconnecting.

And according to one embodiment of the invention, at least two of the metal layers include substantially repeating patterns for portions used for interconnecting.

And according to another embodiment of the invention, at least three of the metal layers comprise substantially repeating patterns for portions used for the interconnecting.

There is thus provided in accordance with a preferred embodiment of the invention, a method of fabricating a semiconductor device, comprising the steps of: providing a semiconductor substrate; forming a borderless logic array, including a plurality of area I/Os, on the semiconductor substrate; and forming a redistribution layer for redistributing at least some of the area I/Os. And also includes the step of utilizing a direct write technique to customize the logic array.

Preferably the step of marking utilizes a direct write technique.

There is thus provided in accordance with a preferred embodiment of the invention, a method of fabricating a semiconductor device, comprising the steps of: providing a semiconductor substrate; forming a borderless logic array, including a plurality of area I/Os, on the semiconductor substrate; and forming a redistribution layer for redistributing at least some of the area I/Os, and wherein the step of forming a borderless logic array comprises the step of positioning the area I/Os in a non-surrounding fashion with respect to the logic array.

There is thus provided in accordance with another preferred embodiment of the invention, a method of fabricating a semiconductor device, comprising the steps of: providing a semiconductor substrate; forming a borderless logic array, including a plurality of area I/Os, on the semiconductor substrate; and forming a redistribution layer for redistributing at least some of the area I/Os, and wherein the logic array includes a repeating core, and wherein the step of forming a borderless logic array includes the step of positioning the area I/Os in a non-surrounding fashion with respect to at least one of the repeating core.

Preferably at least one of the area I/O is configurable I/O.

Preferably also including the step of: performing photolithography, wherein a reticle is projected over the semiconductor substrate, and wherein the used portion comprises elements from two projections.

There is thus provided in accordance with a preferred embodiment of the invention, a method of fabricating an integrated circuit wafer, comprising the steps of: providing a semiconductor substrate; forming a borderless logic array, including a plurality of area I/Os, on the semiconductor substrate; and forming a redistribution layer for redistributing at least some of the area I/Os.

Preferably also comprising the step of: forming pads to connect the semiconductor device to other devices, wherein at least one of the pads overlays at least a portion of the logic array or a portion of the area I/Os.

Preferably also including the steps of: placing and routing a specific design on the logic array; and marking marks for an edge of a used portion of the logic array according to the step of placing and routing.

Preferably the step of marking comprises photolithography, and also includes a step of dicing the semiconductor substrate according to the marks.

Preferably the step of dicing includes a step of laser dicing.

There is thus provided in accordance with a preferred embodiment of the invention, a method of fabricating an integrated circuit wafer, comprising the steps of: providing a semiconductor substrate; forming a borderless logic array, including a memory array, a plurality of area I/Os, on the semiconductor substrate; and forming a redistribution layer for redistributing at least some of the area I/Os.

Preferably also comprising the steps of: placing and routing a specific design on the logic array and the memory array; and marking marks for an edge of a used portion of the logic array and the memory array according to the step of placing and routing.

Preferably the step of marking comprises photolithography, and also comprising a step of dicing the semiconductor substrate according to the marks.

Preferably the step of dicing includes laser dicing.

Preferably the logic array includes a module array.

Preferably the logic array is interconnected by metal layers and via layers, and wherein at least one of the metal layers includes at least one substantially repeating pattern for a portion used for interconnecting.

Alternatively at least two of the metal layers include substantially repeating patterns for portions used for the interconnecting.

Preferably the step of placing and routing is done for a specific design called A' and also for another specific design called B', and wherein the location on the wafer in which design A' is placed is independent of the location on the wafer in which design B' is placed.

Alternatively the step of placing and routing is done for a specific design called A' and also for another specific design called B', and wherein a number of times that design A' is placed on the wafer is independent of a number of times that design B' is placed on the wafer.

Preferably the step of marking includes the step of utilizing a direct write technique.

Preferably the step of placing and routing is done for a specific design called A' and also for another specific design called B', and wherein a silicon area ratio of logic array to memory array in design A' is substantially larger than a silicon area ratio of logic array to memory array in design B'.

Preferably the step of marking includes the step of utilizing a direct write technique.

Preferably also including the step of probing the wafer, wherein the step of probing utilizes the same wafer probe to test design A' and design B'.

Preferably also comprising the step of probing the wafer, wherein the step of probing utilizes the same wafer probe to test design A' and design B'.

Preferably also comprising the step of probing the wafer, wherein the step of probing utilizes the same wafer probe to test design A' and design B'.

Preferably also comprises the step of utilizing a direct write technique to customize the logic array.

Preferably the design A' and design B' are probed simultaneously.

Preferably design A' and design B' are probed simultaneously.

There is thus provided in accordance with additional preferred embodiment of the invention, a method of fabricating an integrated circuit wafer with improved yield, comprising the steps of: providing a semiconductor substrate; forming a borderless logic array,including a plurality of area I/Os, on the semiconductor substrate; and forming a redistribution layer for redistributing at least some of the area I/Os, and further comprising the steps of: testing and marking modules on the logic array; placing specific designs on the logic array so as to avoid faulty modules; and customize the logic array according to placement of specific designs; testing and marking the specific designs; and dicing the logic array according to placement and marking of specific designs.

Preferably utilizing a direct write technique to customize the logic array.

Preferably having one or more pads dedicated to testing.

Preferably also including the step of using a probe card to independently test one or more modules simultaneously.

Preferably one or more of the pads dedicated to testing are not the area I/Os for the specific designs.

Preferably at least one of the area I/Os comprises a configurable I/O.

Preferably the configurable I/O comprises multiple copies of input, output, and pre-output cells, and wherein the semiconductor device further comprises connections between at least one of the input, output, and pre-output cells and area I/O pads to construct an area I/O.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

The present invention is now described with reference to FIGS. 1–25, it being appreciated that the figures illustrate the subjects matter not to scale or to measure.

Figure 1:
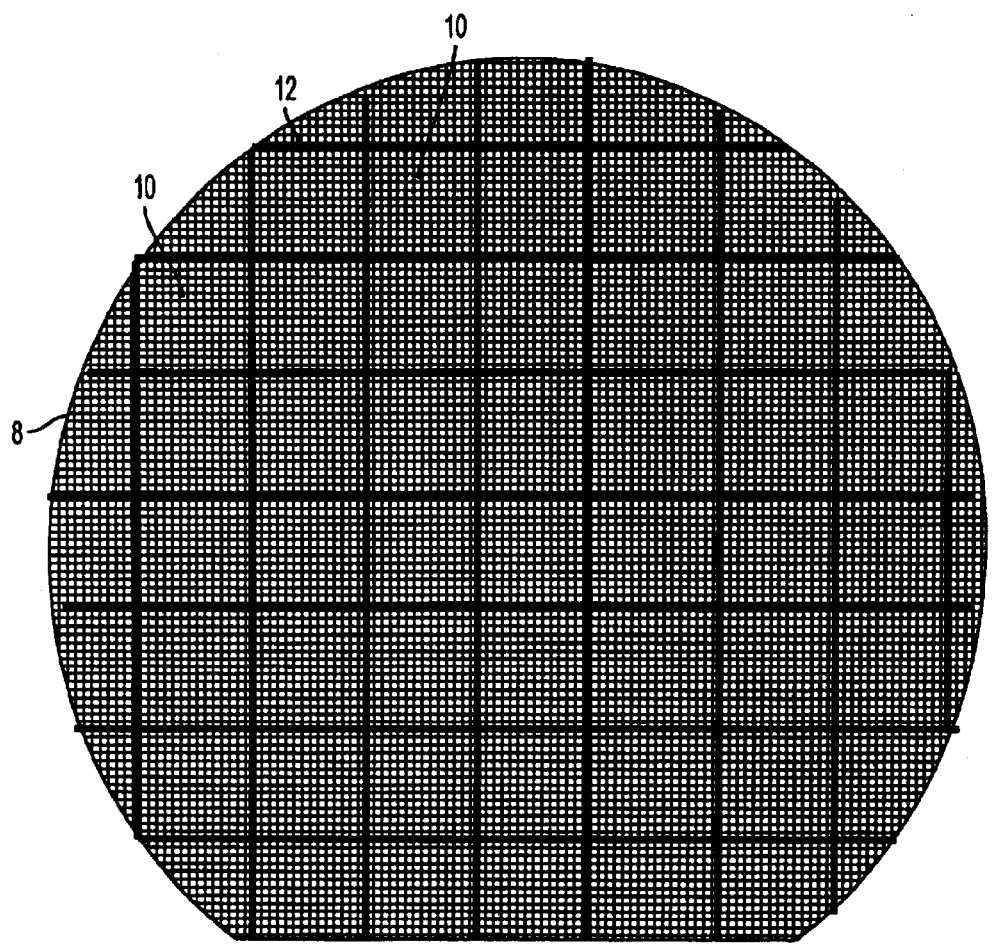
FIG. 1 is a drawing illustration of a wafer marked with reticle projections.

The current method of semiconductor fabrication is on lithography step for each layer. The dominating lithography technique of submicron process is called step and repeat. The layer pattern will be drawn into mask also called reticle. Such reticle may be projected over an area of about 20 mm×20 mm by the lithography tool called Stepper. Then the Stepper steps the wafer so the reticle would be projecting the same pattern on area next to it and so on, and so forth. FIG. 1 illustrates a wafer 8 with marks 12 of reticle projections 10. With an 8-inch wafer, over 50 copies of the reticle will be typically stepped on one such wafer.

The current invention suggests the use of a much less common lithography technique called direct-write using e-Beam. Such could be done, for example, with direct-write e-Beam—Leica ZBA32 offered by Leica Microsystems Lithography GmbH Jena, Germany or F5112 offered by Advantest, Japan. Direct-write e-Beam allows direct writing any pattern at any location over the wafer, without the use of a physical mask. Direct-write e-beam is not used in commercial fabrication of semiconductor devices due the low throughput and the implication of such on a single wafer cost. The current invention suggests the combination of reticle technique for the generic portion of logic array and the use of direct-write e-Beam for the custom layers. A very good fit with this method is the logic array invented by eASIC, as only it provides a logic array that could be customized with single via layer. Via layer can be written much faster than metal layer with direct-write e-Beam and would make such combination method commercially viable.

Such direct-write e-Beam fabrication method are highly attractive for custom designs as previously described. Since single wafer may have room for hundreds of devices, the current invention seeks to allow multiple designs to be placed on one wafer and further, to allow each of these designs to be of different size and, even further, to allow placing different quantities of such designs on a single wafer, to support on one wafer the fabrication needs of both prototype volumes for some design and pre-production volumes for other designs.

While direct-write e-Beam is the most common technique, other direct-write lithography could be used. A laser mask write systems like Sigma 7000 from Micronic could be modified for such usage.

Figures 1, 2:
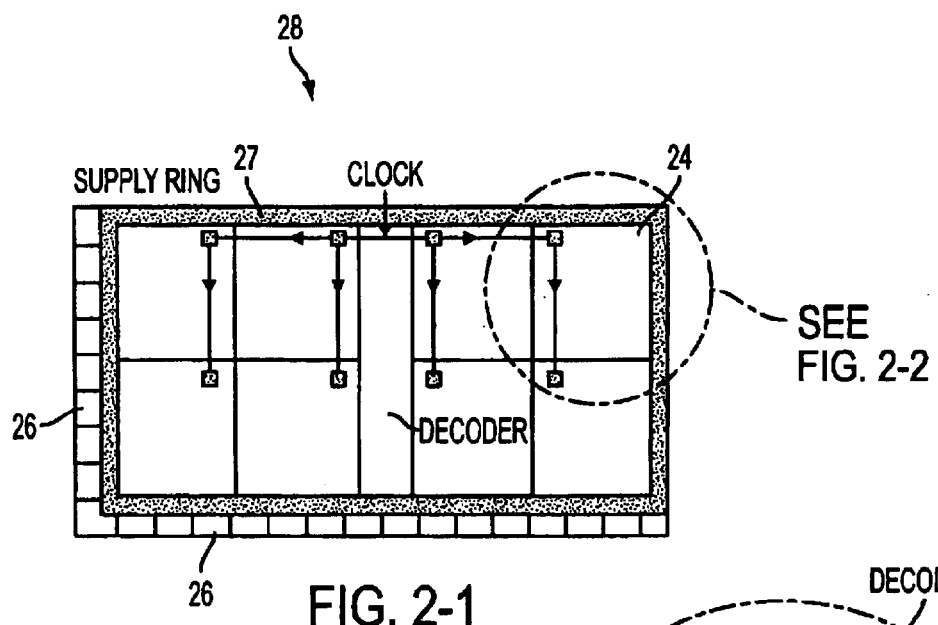
FIG. 2, consisting of FIGS. 2-1, 2-2, and 2-3, is a drawing illustration of a repeating core.
Figure 2:
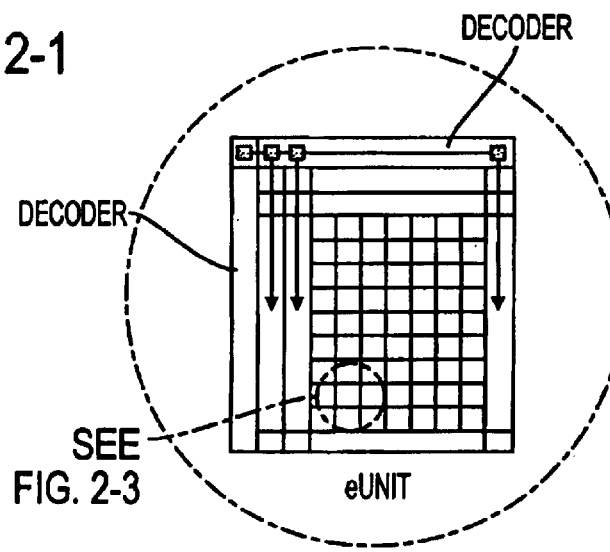

The current invention suggests a new architecture of logic array. This new architecture blends logic array with array of area I/O and array of area pads. Therefore it provides a continuous fabric instead of the master slice approach. Such fabric could comprise of a repeating structure—repeating core—as is illustrated in FIG. 2. The repeating core 28 comprises a set of area I/O 26 and then logic array 24 which is constructed from array of eCells 22. The area I/O may be constructed with thick oxide to allow them to operate at higher voltage appropriate to interface with the element outside the device, while the logic array might be using thin oxide to operate at low voltage to reduce power consumption and allow higher performance and packing density. The area I/O might comprise elements that are common at boundary I/O such as ESD protection and latch-up protection. The area I/O could be configurable I/O that could be customized to the specific function by the custom layers used to customize the logic. The area I/O could include fixed function like input and output functions. The power supply to the core 28 and to the area I/O 26 could be supplied from the same group of area pads.

Figures 2, 3:
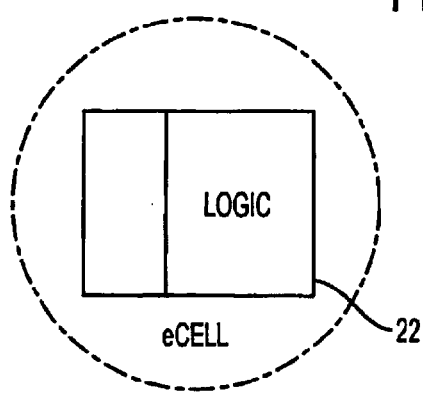
Figure 3A:
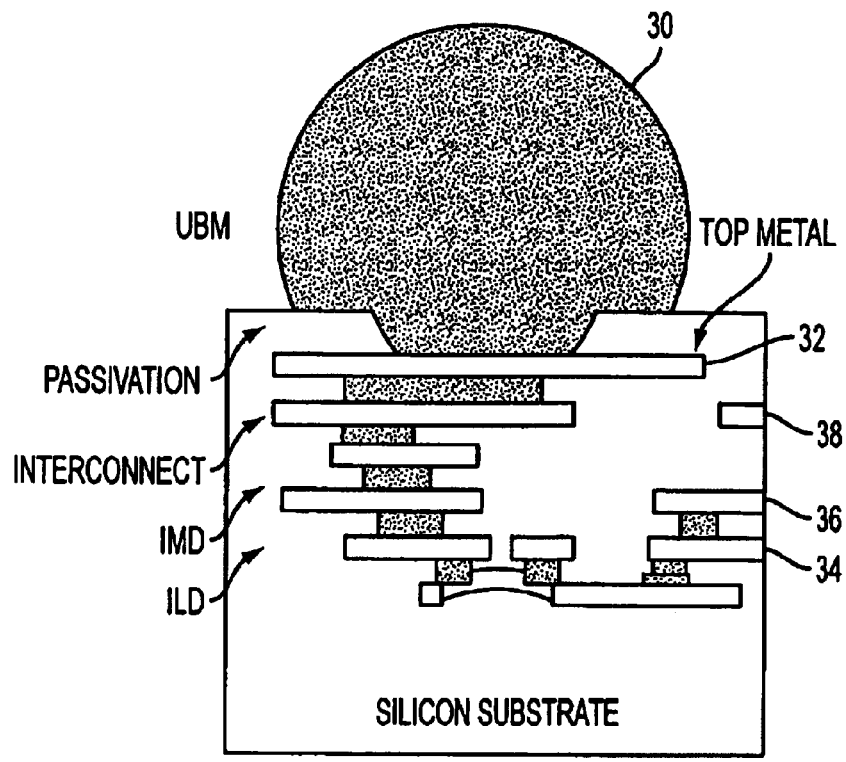
FIG. 3A is a drawing illustration of a area pads.
Figure 3B:
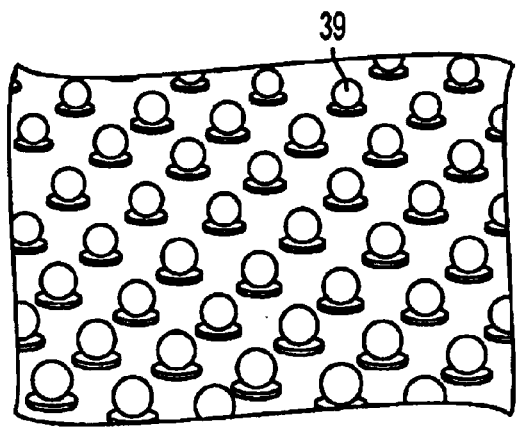
FIG. 3B is a pictorial illustration of a area pads—soldering balls.
Figure 4:
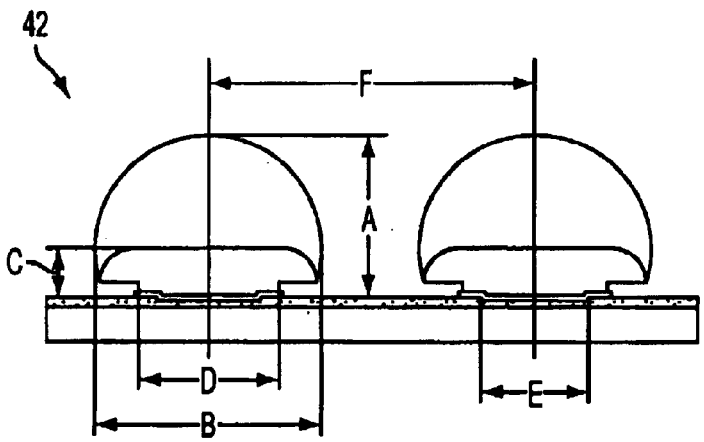
FIG. 4 is a detail drawing illustration of the area pads.

FIG. 3 is a drawing and pictorial illustration of the area pads. FIG. 3A is a vertical cut drawing showing one area pad and the associated bump 30, and the layers underneath it including a thick layer 32 sometimes called redistribution layers and the underlying layers such as Metal-1 34, Metal-2 36 and Metal-4 38. FIG. 3B is a pictorial of section of the top surface of a device according to the current invention, with a regular array of area pads in the forms of bumps 39. FIG. 4 is a detailed drawing illustration of an area pads and sample sizes for such bumps. To maximize the number of pads per area, it is common to place the area pads in a regular array as can be seen in FIG. 3B. Consequently it is useful to have a top metal layer for pads redistribution, to allow area pads placement to be independent from area I/O placement.

Figure 5:
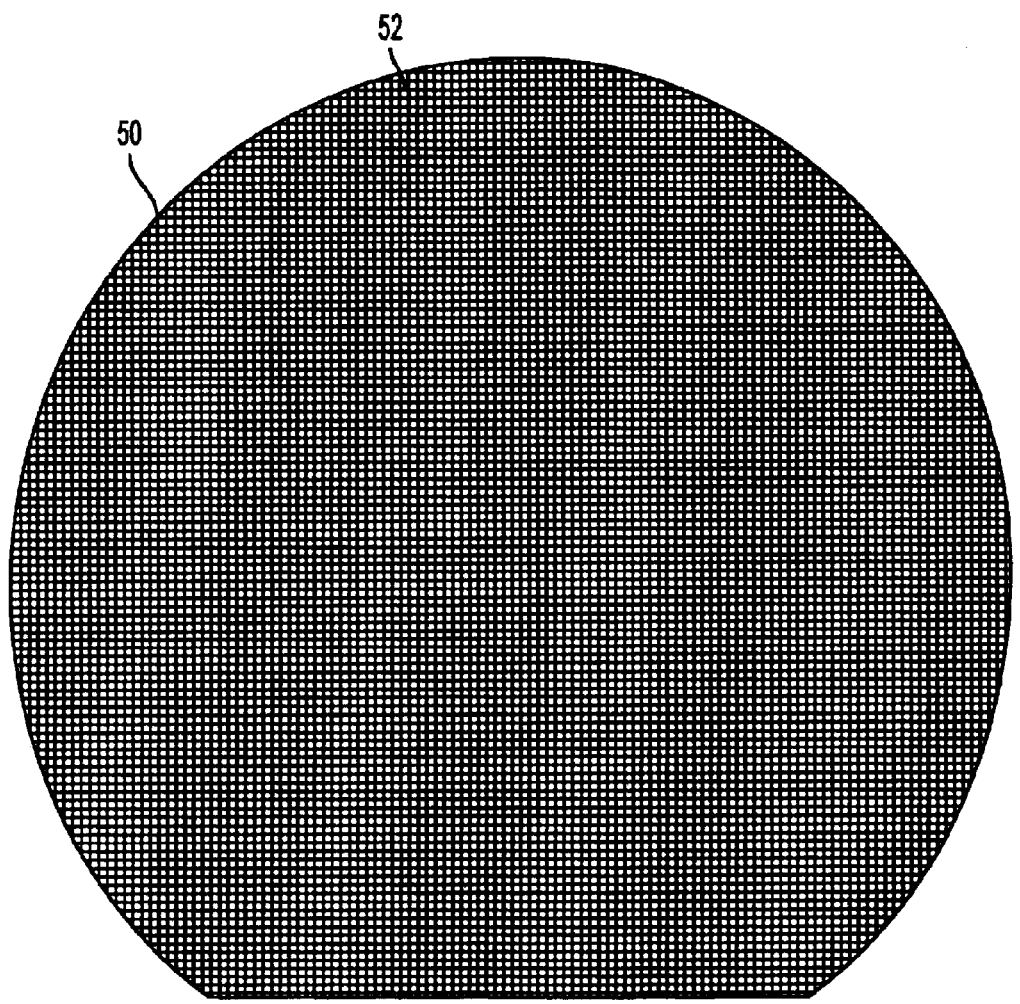
FIG. 5 is a drawing illustration of a wafer level borderless logic array.

This invention suggests a fabric of a repeating core which include logic, area I/O, and area pads. The minimum size of such core would be to fit single area pads like 3A. In most cases a larger size core would be more practical. The core 28 of FIG. 2 is about 1 mm×0.5 mm in 0.13 micron process. It would be quite possible to provide 4×2 area pads and the appropriate number of area I/O with it. Tilling such core to span a full wafer will allow a fabric of borderless logic array of about 20×40 cores 28 in one reticle. If the accuracy of the stepper is high enough, it would be conceivable that the borderless fabric could be extended up to wafer level. In such case it may require somewhat less dense lithography pitch for the routing structures, to allow spanning across reticle boundaries. The wafer level borderless fabric provides he highest level of flexibility and wafer utilization effectiveness. For the ease of description, the following detailed description of the additional preferred embodiments of this invention assumes wafer level borderless logic array. FIG. 5 is a drawing illustration of a wafer 50 comprising of wafer level borderless logic array of continuous tilling of cores 52.

Figure 3C:
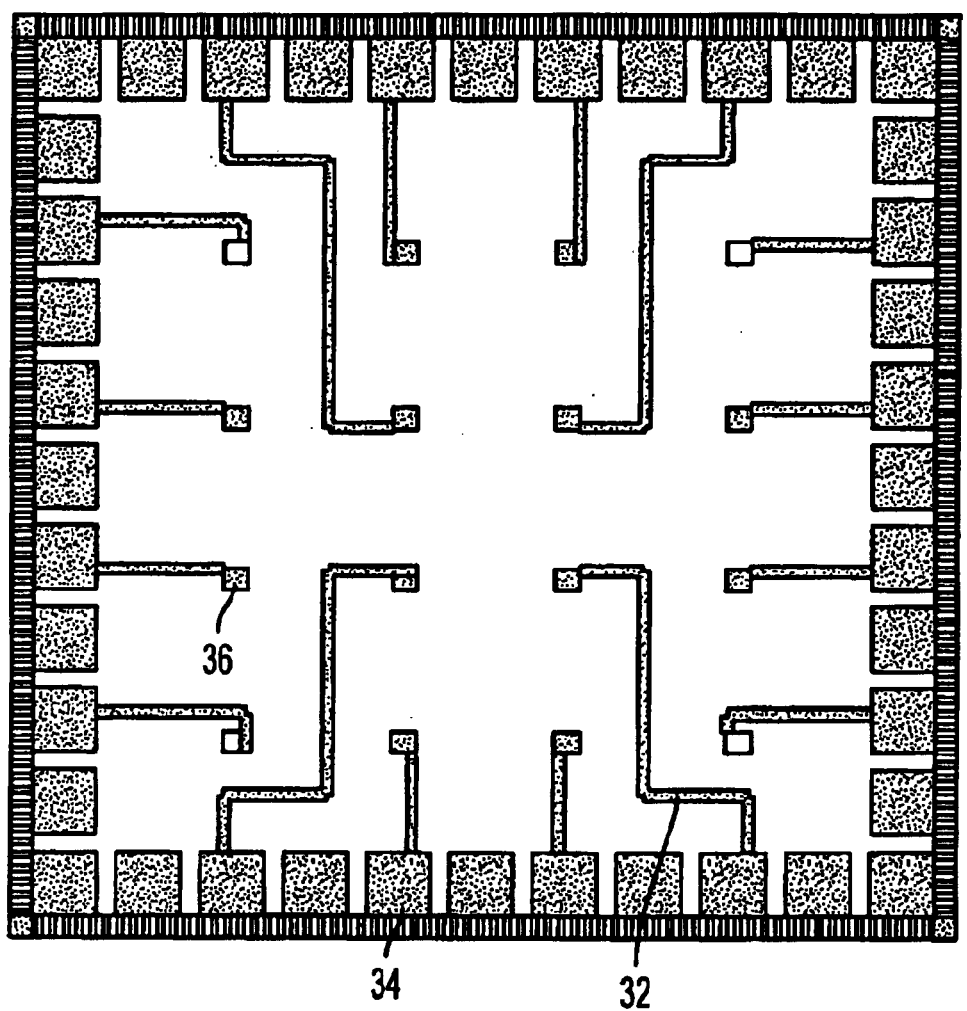
FIG. 3C is a pictorial illustration showing the use of a redistribution layer to connect area I/O to edge pads.

The redistribution layer may also be a custom layer. It could therefore be custom designed to redistribute the area I/O to the edge pads in a specific design and therefore allow such custom design to be packaged using conventional bonding rather than Flip-chip. FIG. 3C illustrates the use of redistribution layer 32 to connect area I/O 36 to edge pads 34 so wire bonding could be used.

Figure 6:
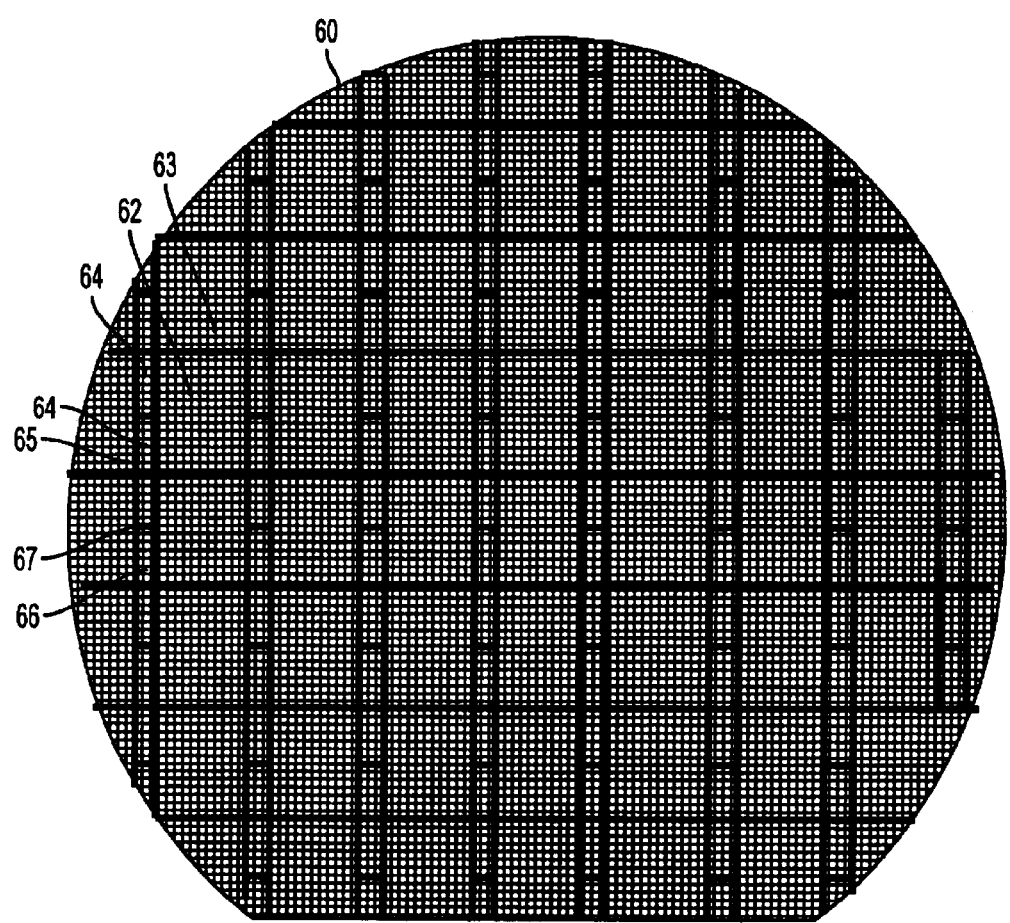
FIG. 6 is a drawing illustration of a wafer shared between two applications utilizing reticle sharing.

FIG. 6 is a drawing illustration of a wafer shared between two designs utilizting reticle sharing. FIG. 6 illustrates the existing art of reticle sharing wherein one reticle may include design A' 62 which is placed and routed on the logic array and occupies a large portion of the reticle, and design B' 64 that is smaller and could be placed two times within the reticle, so together with design A' the reticle is fully utilized. Design A' edges are marked by marks 63 and 66 and design B' edges are marked by marks 65, 66 and 67.

It might be highly desirable to have these edges 63, 65 marked by lithography and following process to allow proper dicing of the wafer. Such marking would be best done at the top or very close to the top layer and prior to the bump processing step. Such marking step is not usually required for logic array where the master slice are arranged for specific array size, and where the boundary pads, together with the space between devices, make it very visible where dicing should take place.

It is clear that conventional saw dicing would be proper for dicing the wafer 60 from design A' point of view. Yet the edge 67 would be left to be diced at a later stage to separate the two dies of design B'.

The current invention provides the ability to size each design independently and to mix different designs on single wafer. Constraining dicing along straight continuous lines places a strong limitation on the ability to share one wafer with multiple-sized designs. It is therefore suggested to use laser dicing for wafers fabricated according to the current invention. Laser dicing is being developed and offered by few companies such as DFL7160 made by Disco Corporation Tokyo, Japan, and Multidice made by NanoVia, LP of Londonderry, N.H. Thinning the back of the wafer may be required so laser dicing would allow for a full cut rather than just scribing.

Figure 7:
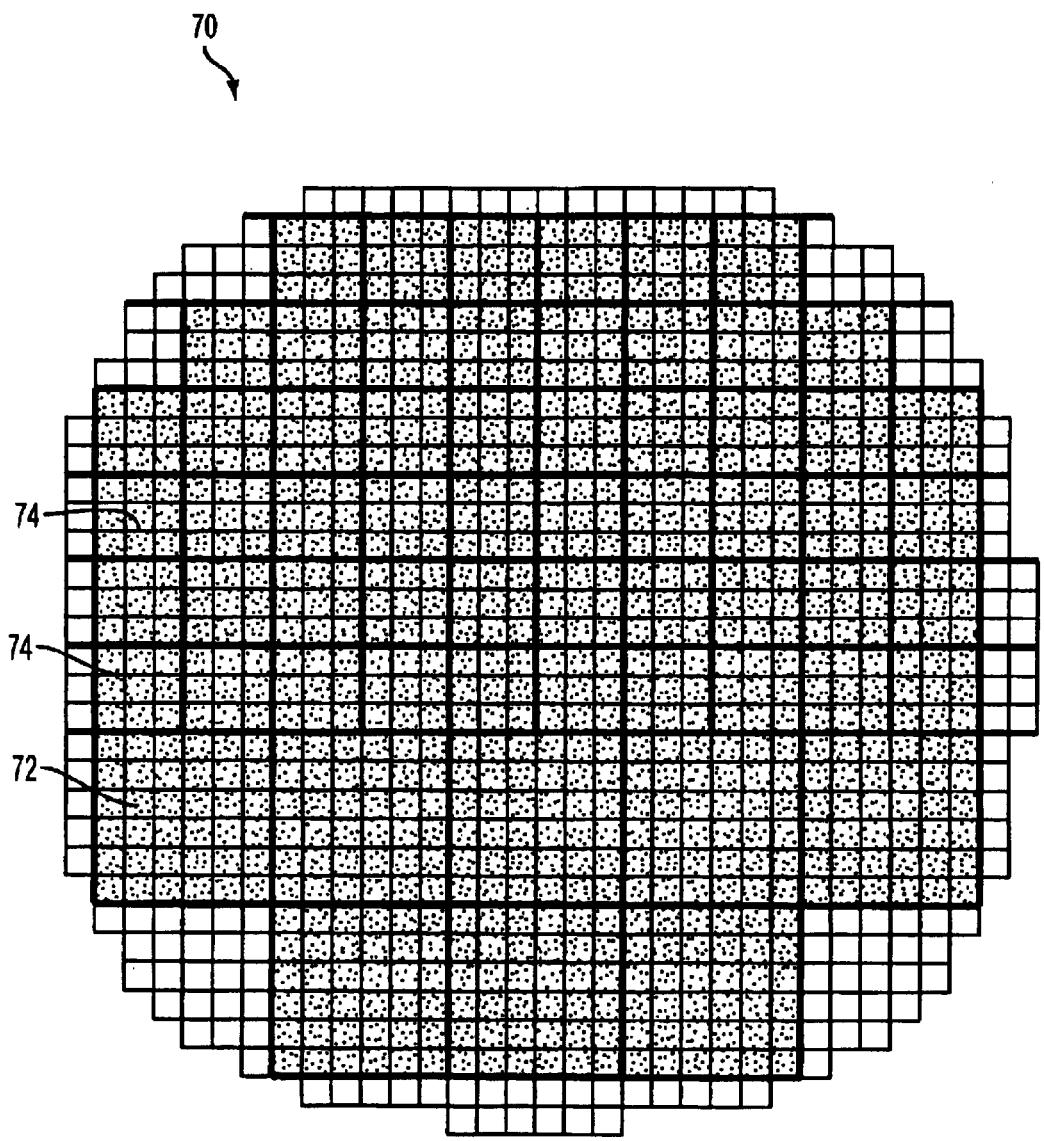
FIG. 7 is a drawing illustration of a wafer shared between two applications.

In another embodiment of the current invention, a very flexible wafer sharing is suggested. Such wafer sharing provides much higher flexibility than reticle sharing. FIG. 7 is a drawing illustration of a wafer shared between two applications taking advantage of the borderless array, together with the use of direct-write for wafer level lithography. It is therefore possible to mix different designs at various quantities on such wafer. FIG. 7 illustrates design 72 placed for prototype stage, while another design 74 is placed many more times. Unlike the case with reticle sharing, the locations and the number of times one design is placed on a wafer has little bearing on the other design. An important advantage of this invention is that the location on the wafer in which one design is placed, is independent to the location on the wafer in which a second design is placed, other than the obvious limitation that it can not be placed in location already taken by the first design. More importantly, the number of times one design is placed is independent to the number of times the other design is placed.

Figure 8:
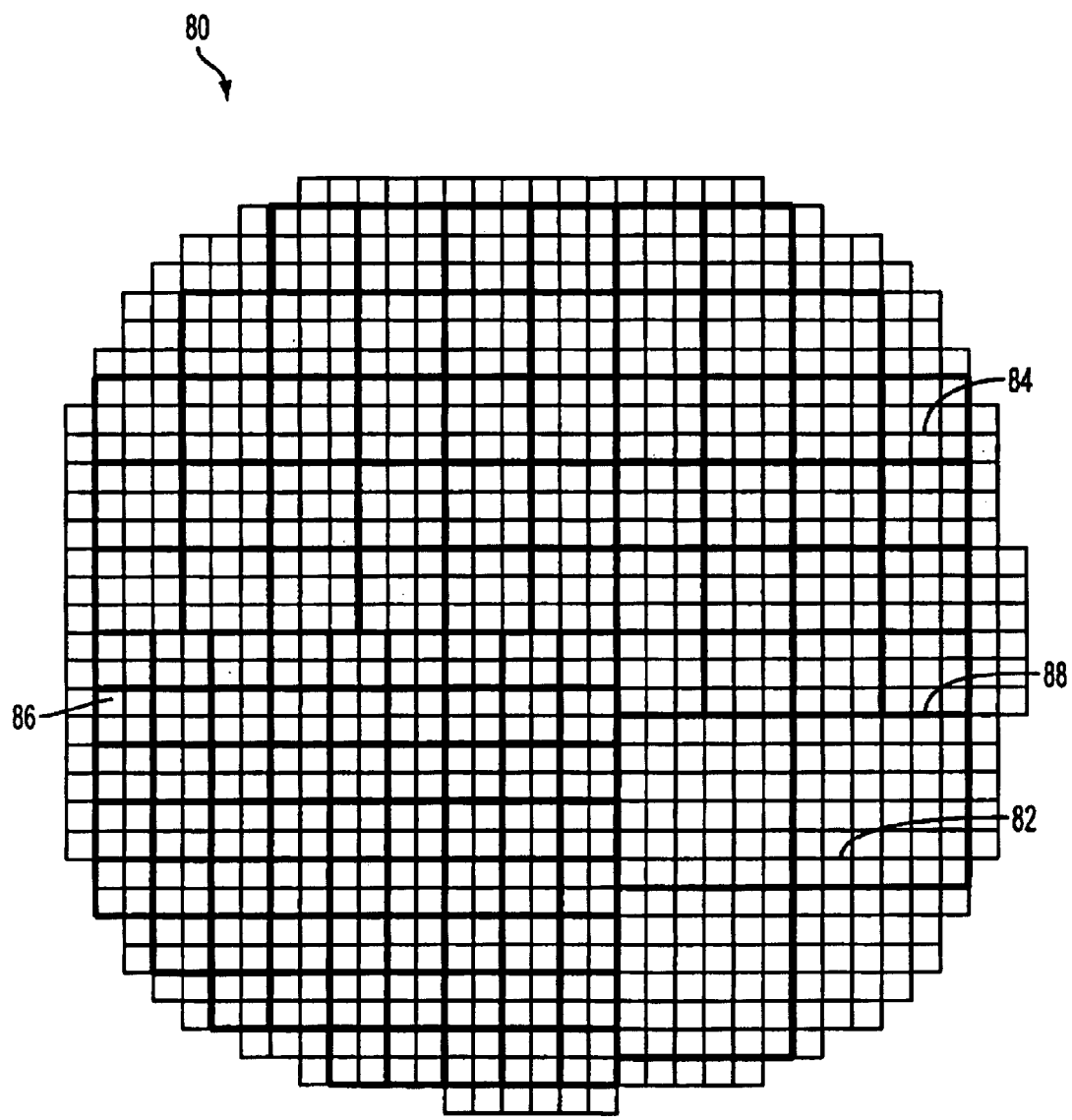
FIG. 8 is a drawing illustration of a wafer shared between three applications.

FIG. 8 is a drawing illustration of a wafer 80 shared between three applications. Design 82 has three sites on the wafer, which represent prototype level. Designs 84 and 86 have tens of locations assigned to them. It is clear that the location and the number of sites for design 86 are independent on those of design 82. In addition it should be noted that many of the dicing lines 88 do not extend from one edge of the wafer 80 to the other edge. Dice lines 88 do not fit saw dicing, but rather require the use of a flexible dicing approach such as laser dicing.

Many logic arrays are now offering logic fabric with additional functional blocks such as memory blocks, processors or special elements like PLL. Typically the embedded memory takes the second largest portion of the master slice area after the logic array. In general embedded memories are constructed as a small array of configurable memory blocks. The custom design may need certain amount of memory or some number of PLL and so forth. It is an increasing challenge to select the right master-slice combination, since designs with similar amounts of logic may require very different amounts of memory.

In yet another embodiment of the current invention, the continuous logic array fabric is comprised of a continuous logic array and continuous memory array of small memory blocks. It therefore now possible that a specific design will be placed on a section of such continuous fabric, sized to have exactly the desired amount of logic and the desired amount of memory.

Figure 9A:
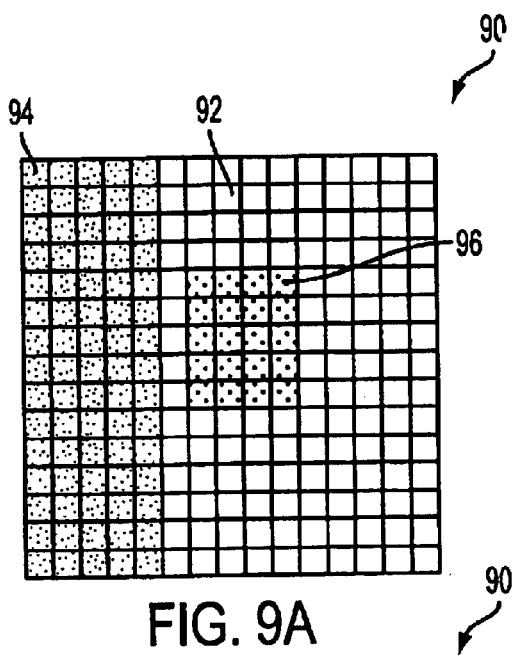
FIG. 9A is a drawing illustration of a reticle fabric.
Figure 9B:
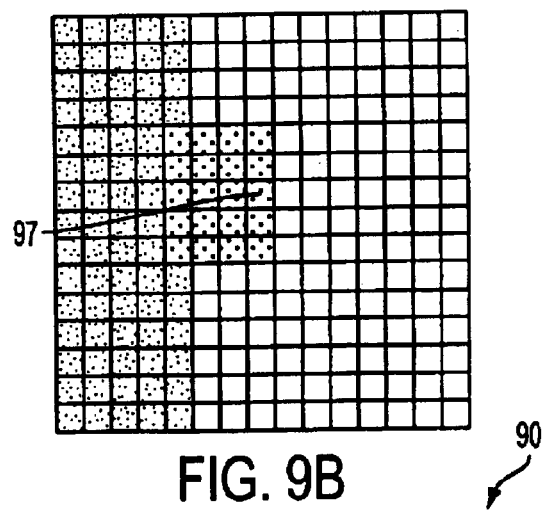
FIG. 9B is a drawing illustration of a reticle fabric.
Figure 9C:
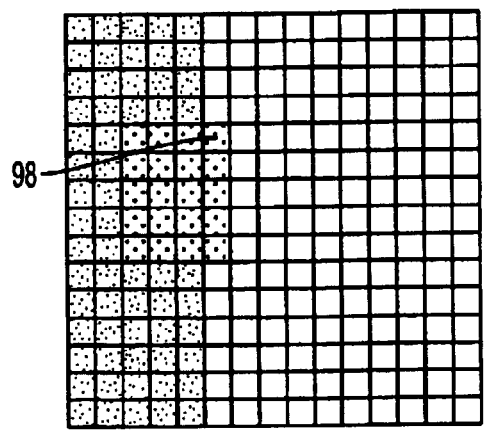
FIG. 9C is a drawing illustration of a reticle fabric.
Figure 10A:
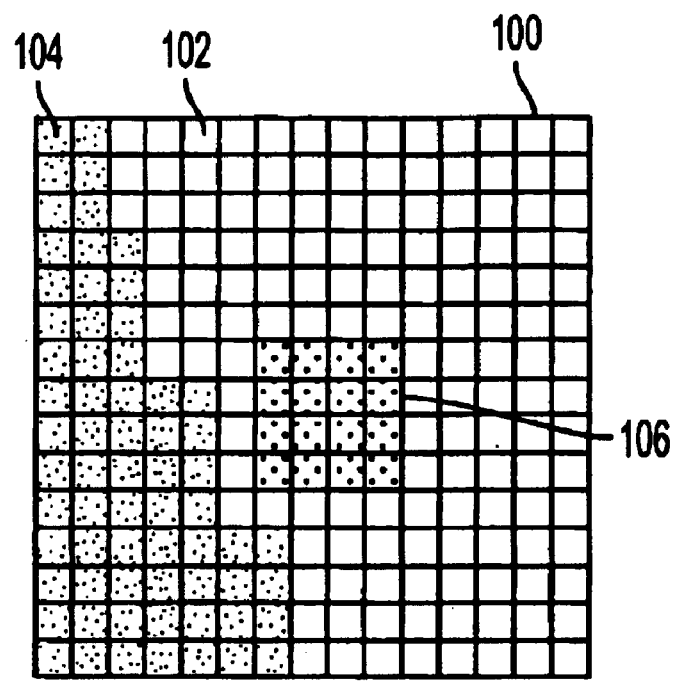
FIG. 10A is a drawing illustration of a reticle fabric.
Figure 10B:
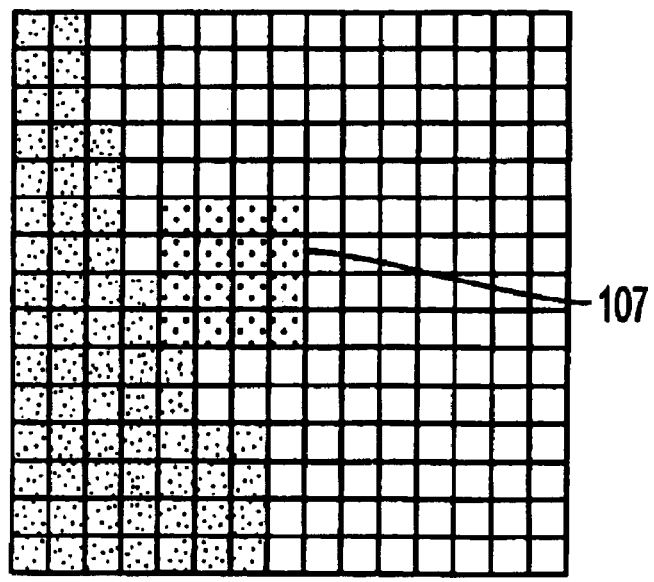
FIG. 10B is a drawing illustration of a reticle fabric.

FIG. 9 is a drawing illustration of a reticle 90 fabric comprising of continuous logic array 92 and memory array 94. FIG. 9A illustrates a custom design placed on such terrain as marked by the rectangle 96 to have no memory. FIG. 9B illustrates a custom design placed on such terrain as marked by the rectangle 97 to have some memory. FIG. 9C illustrates a custom design placed on such terrain as marked by the rectangle 98 to have a small amount of logic and all the rest being memory. FIG. 10A is a drawing illustration of a reticle fabric 100 wherein the memory terrain 104 is shaped in a staircase manner. FIG. 10B illustrates that such staircase arrangement provides a higher level of flexibility with regards to the amount of memory blended into the rectangular markings of the custom design.

The advantage of continuous terrain is the ability to use one set of generic masks to cover many variations of product fabrics, with the ability to tailor the right amount of logic with the right amount of memory. The additional advantage is the ability to use one wafer run to make a flexible mix of custom products. It is usually highly desirable to utilize the silicon area as effectively as possible. Yet it may often happen that by tailoring the amount of logic and memory to the need of a specific design, the tiling efficiency is compromised. The number of devices on one wafer would be at least the number of times the reticle is stepped over the wafer. If high volume production is required then custom masks could be fabricated so volume production would be done at maximum silicon utilization.

Figure 11:
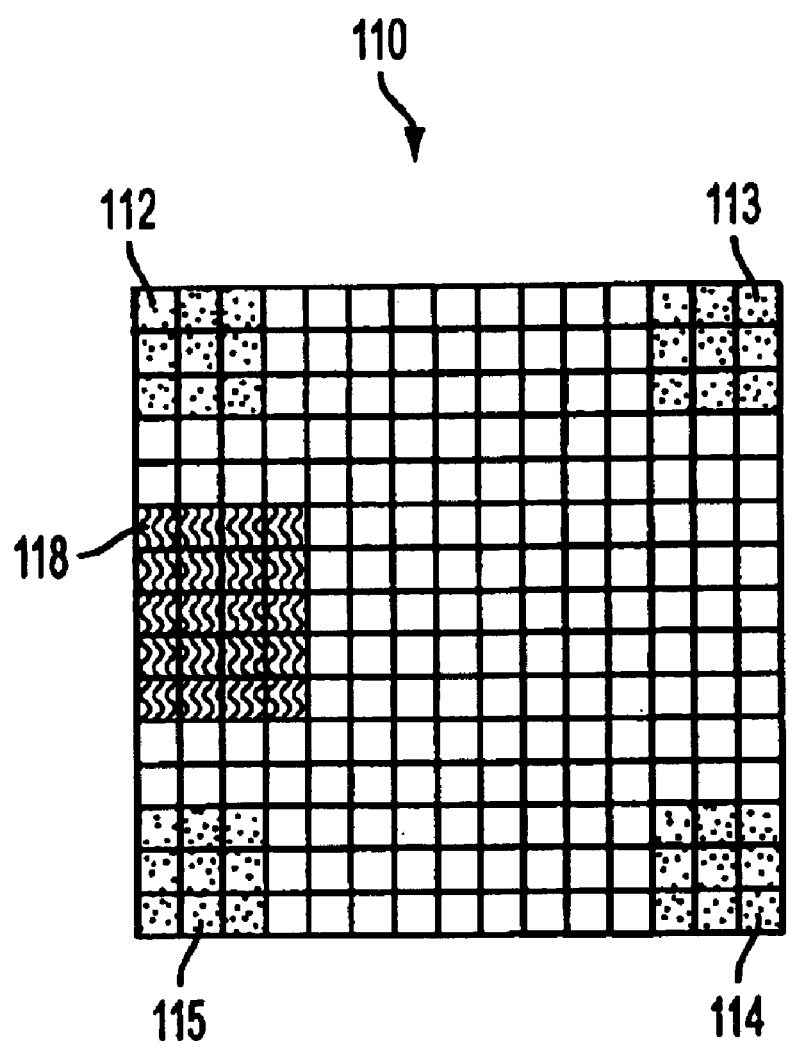
FIG. 11 is a drawing illustration of a reticle fabric.
Figure 12:
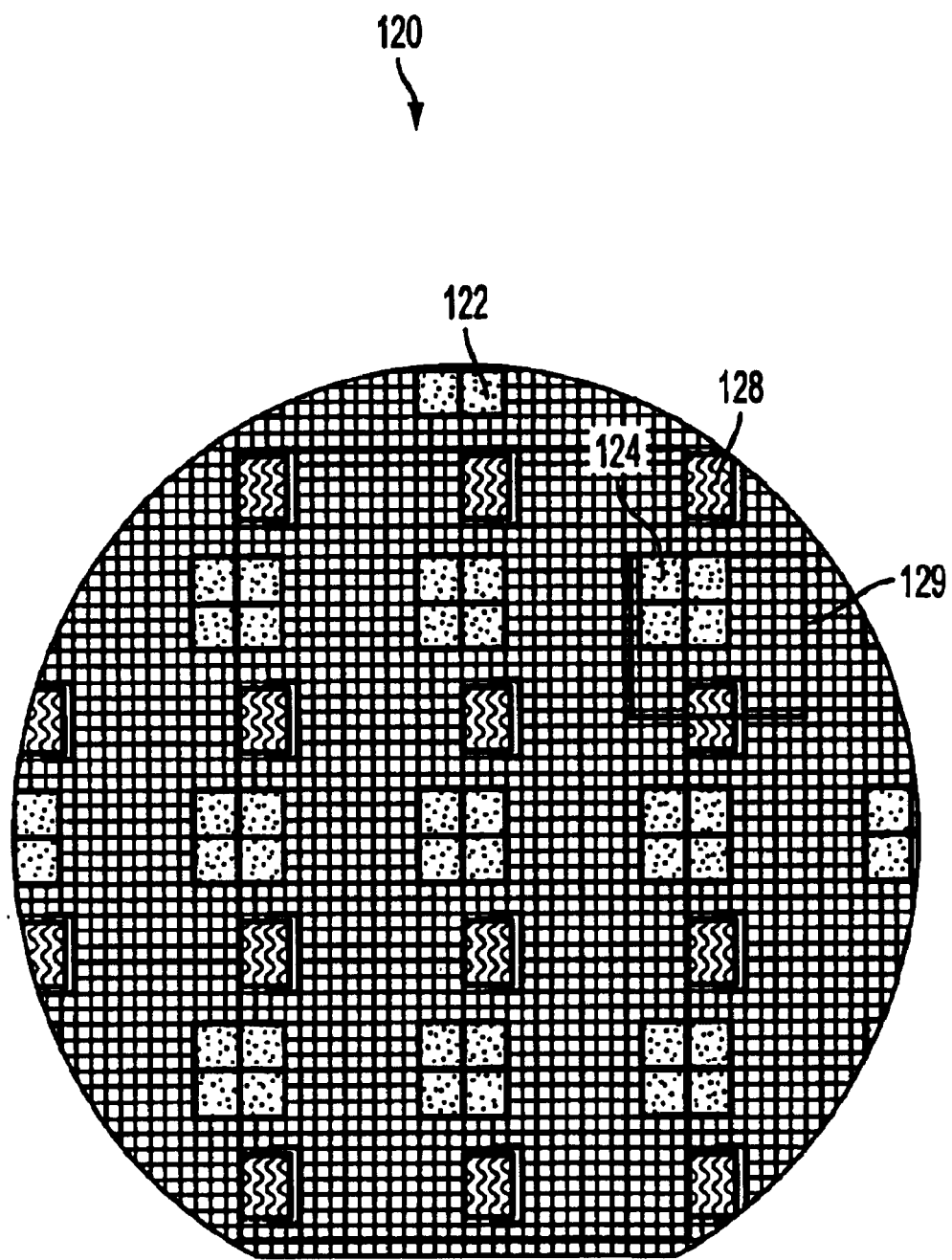
FIG. 12 is a drawing illustration of a wafer marked with reticle projections.

FIG. 11 is a drawing illustration of a reticle 110 of a logic array that in addition to array of logic fabric comprises additional functional logic elements like processor blocks 112, 113, 114, 115 and memory array 118. FIG. 12 is a drawing illustration of a wafer 120 marked with reticle 110 projections. FIG. 12 illustrates the use of the wafer terrain to carve out specific design 129 to include elements from four different reticle projections 124—four processors—with a portion of the memory array 128. By proper placing a specific design 129 on the wafer terrain, it is possible to optimize the silicon area and yet provide a different mix of elements from one generic fabric.

Figure 13:
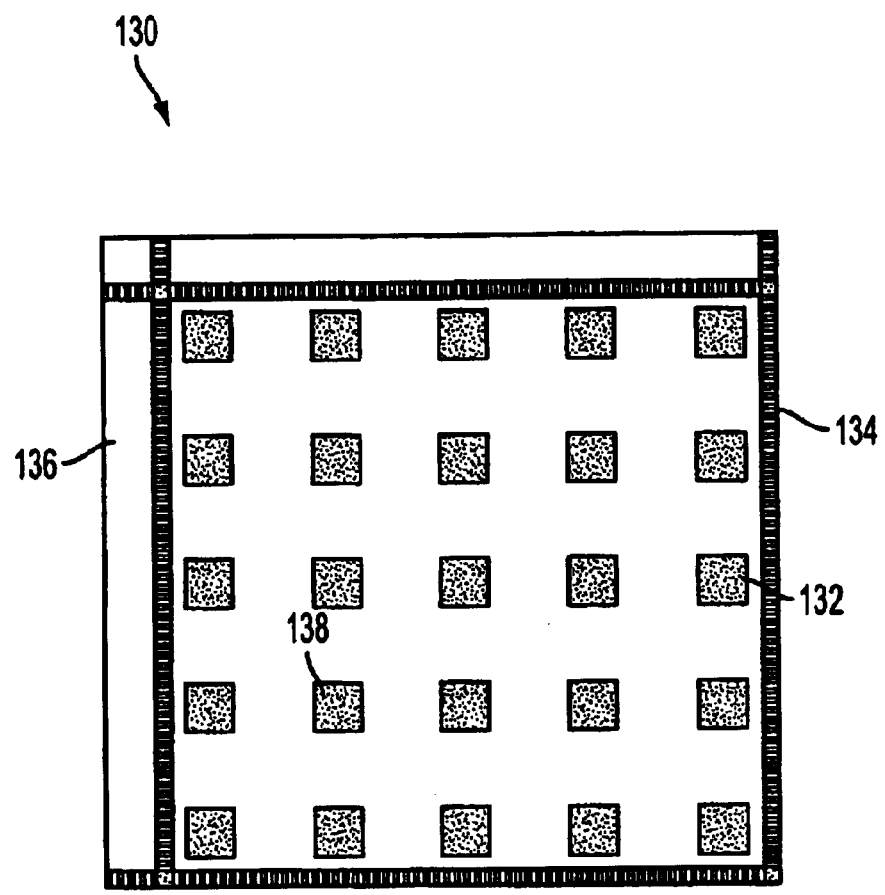
FIG. 13 is a drawing illustration of a module.

The construction of borderless logic array according to the current invention should include consideration for wafer dicing. The common way is to draw a scribe line indicating were the wafer will be scribed, to allow the dicing of the wafer into many individual dies. Typically a laser scribe can cut a 50 microns wide width, but it may be preferred to plan for scribing width between 75 to 100 microns wide. Preferably the continuous array is constructed as array of modules. A preferred module is rectangular with each side sized between 0.5 to 2 mm. A module could be array of logic or array of memory or combination thereof, which may include other special function like PLL. A preferable location for scribe lines is the edge of such module. The location for potential scribe line may include transistors, which would not be powered if that scribe line is used for dicing. Alternatively it could be designed so only connectivity structures are placed in the scribe lines designated areas. FIG. 13 is a drawing illustration of a module 130 with designated area for scribe line 136 and customizable connection 134 to the scribe line routing fabric (not shown). The customizable connection 134 allows disconnection from the routing fabric at the scribe lines area, if that potential scribe line is designated for dicing . The repeating module 130 comprises of pads 132 for the I/Os that are included in the module 130 and pads 138 for the supply powering the circuits within the module.

Figure 14:
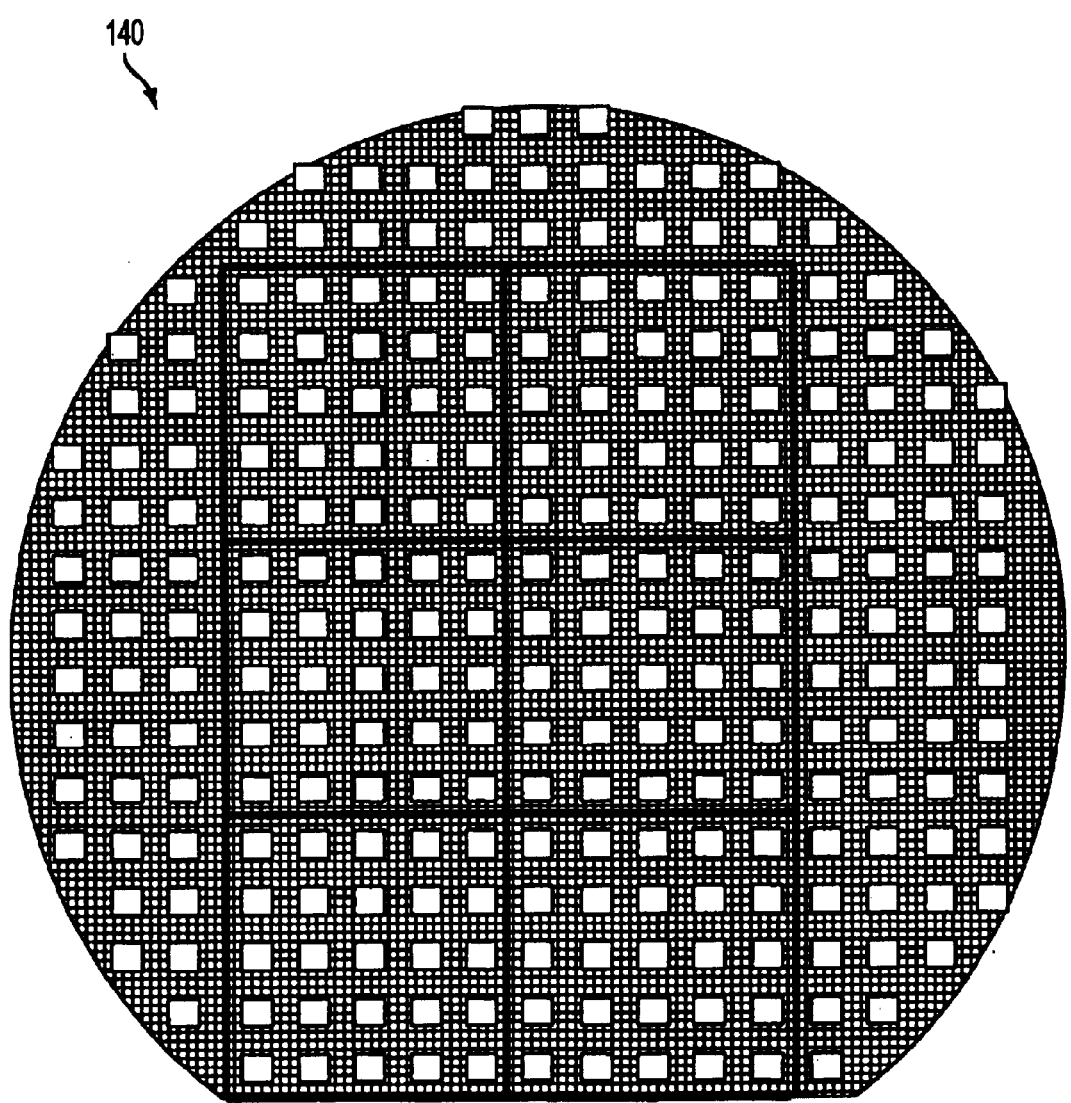
FIG. 14 is a drawing illustration of a wafer comprise wafer level borderless logic array covered with Area Pads.

Yet another advantage of the current invention is the possible use of single Probe Card for multiple designs. FIG. 14 is a drawing illustration of a wafer comprised of wafer level borderless logic array covered with Area Pads. The pads area of the wafer is uniform and is independent of the specific design size and placement. With such regularity, it is possible to construct single probe card to allow testing of the wafer by stepping over it. Under proper software control a single Probe Card could be used to test any device on the wafer 140. Similarly, it is also contemplated that a single Probe Card may be used to simultaneously test multiple dies on the wafer, or with the proper test logic, test a die with more area pads than probes on the Probe Card.

The current invention is not limited to products that combine generic layers with custom layers. Rather it could be use to build a borderless FPGA product. A borderless FPGA wafer could than be diced to provide many options of gate count and block memory size from one base mask-set.

Another use of the current invention is to yield a very large device. Very large devices are subject to very low yield, which make them economically unviable. Under the current invention yield can be improved if the following procedure is applied:

(1) Test the substrate layers prior to the custom masks. This implies that each module is independently tested. To do this there need to be pads dedicated to some functions like clock, scan-in, scan-out, and test control. Probe technology exists to probe pads as small as 20×20 microns with minimal damage, though special alignment equipment will probably need to be integrated into existing standard Probers.

(2) Place the specific design so as to avoid faulty substrate cells. This requires a special placement program, to make the best use of the available wafer area given the outstanding orders of dies to manufacture. Presumably this also controls the designation of the direct write of the adapted for yield custom via patterns.

(3) Dice the wafer accordingly.

The resulting system should provide significant yield improvement over existing techniques. Rough analysis suggests that pre-testing and dynamic placement of die can double the revenue per wafer over conventional techniques, if a sufficiently wide range of die sizes are required for production. It should also be noted that, as with the other techniques above, larger dies than such as are currently possible with existing stepper technology could be produced. In that case the described yield enhancement is crucial.

It is further contemplated that the dedicated pads needed for testing may or may not coincide with the area pads as shown in FIG. 3c. It is also contemplated that the pads necessary for testing may have the same configuration regardless of the type of module, such that the probe card may be configured to simultaneously probe any combinations of modules at a time.

In another embodiment, test, power, ground and clock logic may be tied together at the wafer level, such that a single probe of the wafer is sufficient to test all of the modules within the wafer. Subsequent customization and scribing then isolates the power, ground, test and clock logic to specific modules and dies, to reduce the need for special pads, and pre-customization test time.

Figure 15:
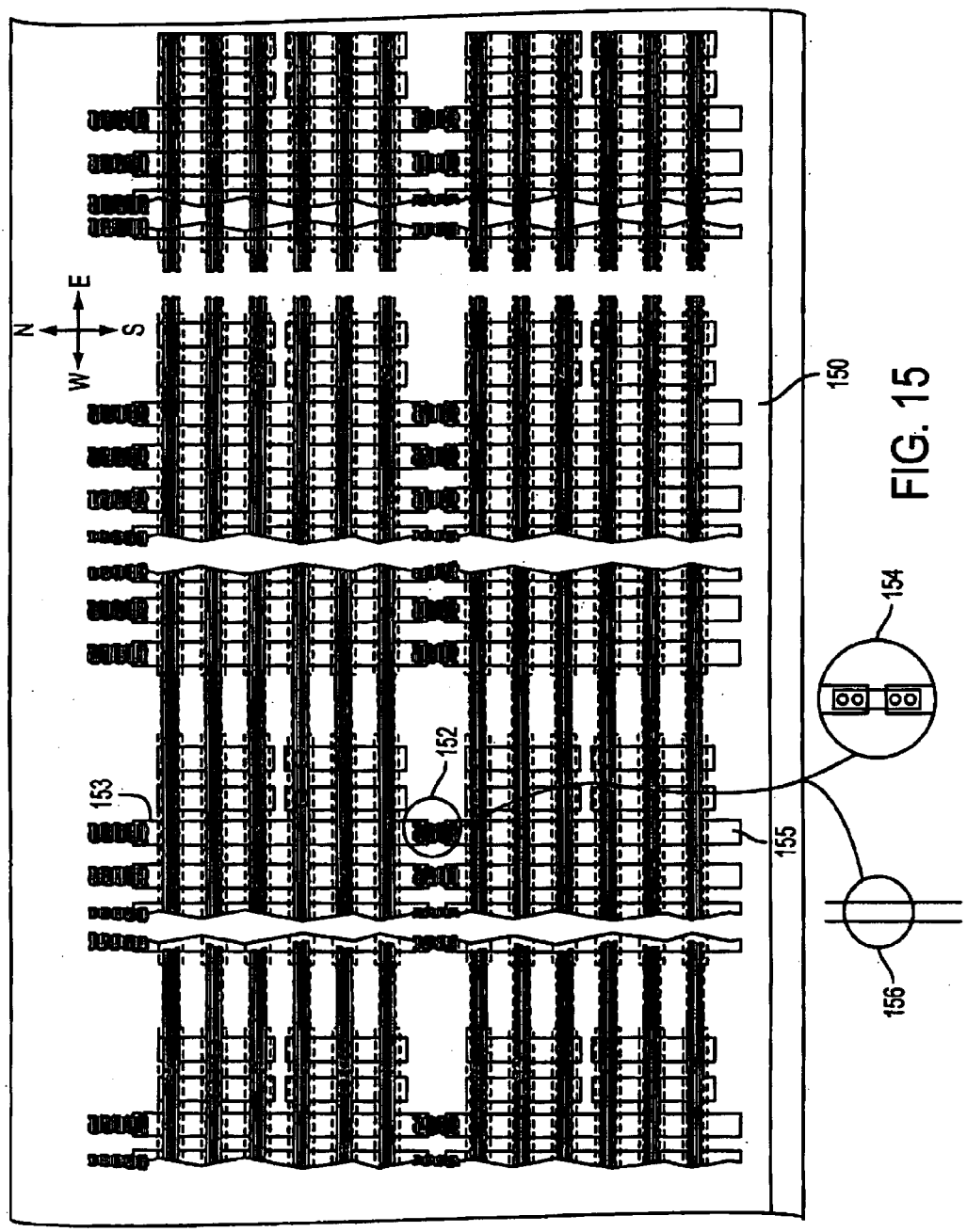
FIG. 15 is a drawing illustration of via customizable routing structure.

FIG. 15 is a drawing illustration of via layer customizable routing structure 150. In some fabrication processes a via layer might have reduced yield. A variation of the structure 150, that uses double via for the continuation bridges 154 instead of single via 152, could be an effective solution. Via customizable routing fabric increases the use of vias primarily in the form of same direction connections utilizing small bridges. Therefore bridges employing double vias are an effective solution. It should be pointed out that double via bridges imply cost, by reducing the number tracks available for routing.

An alternative solution could be employed for volume production. It suggests that in addition to the custom via layer, the two metal layers could use custom mask that connect the segments 153, 155 with the same metal layer 156.

For volume production additional yield enhancement technique could be employed. For example, a software routine can inspect the custom design and replace any single via with a double via where possible. Having most of the patterns in an array form with a highly repetitive structure make it very friendly to employment of yield enhancements. It is possible to keep track of yield loss in production of specific designs that utilize the same logic array fabric. Any failure mechanism could then be reviewed for yield enhancement. The yield enhancement may involve changing the layout of the generic logic array and therefore replacing some of the generic masks.

Figure 16:
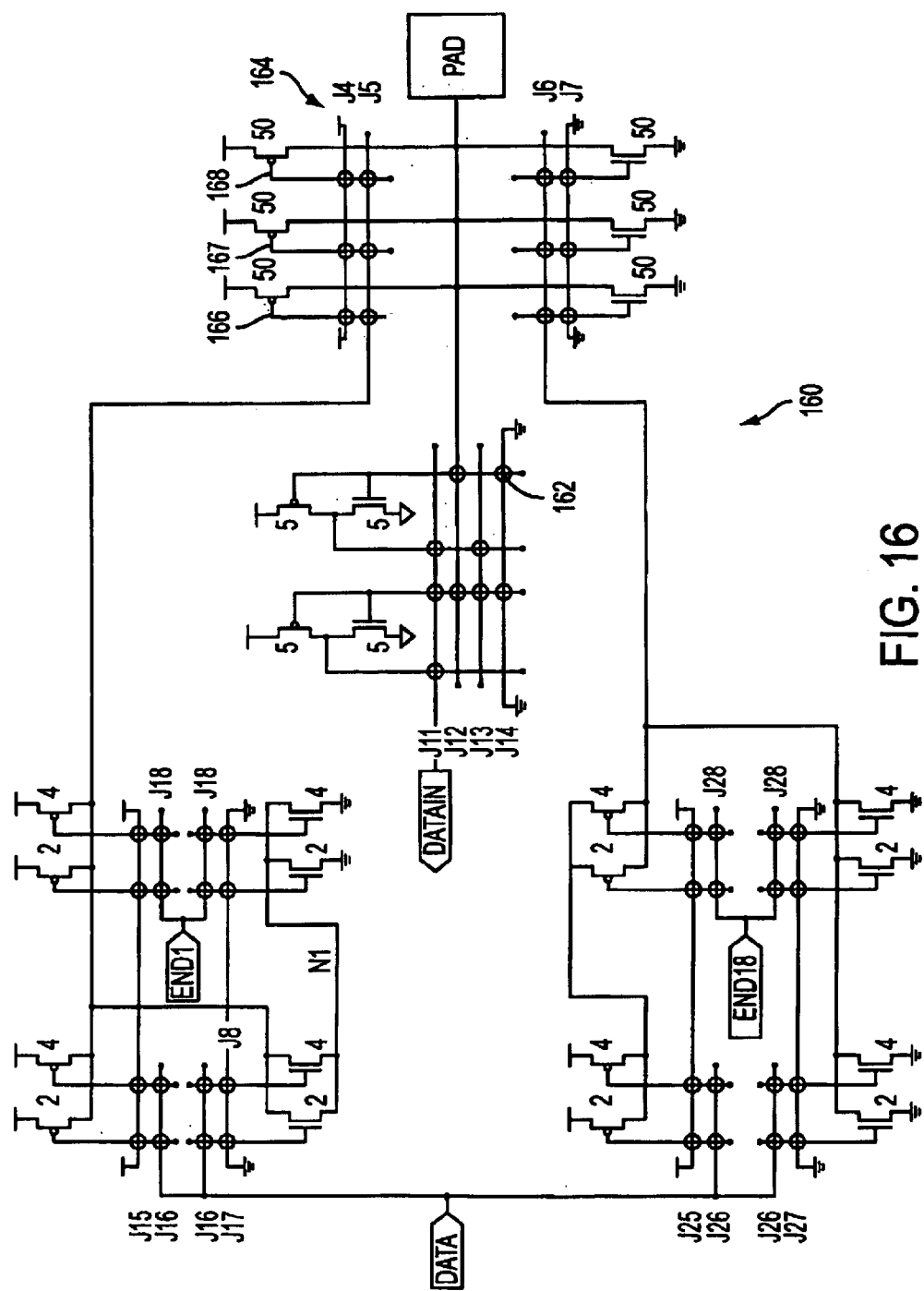
FIG. 16 is a drawing illustration of via customizable I/O.
Figure 17:
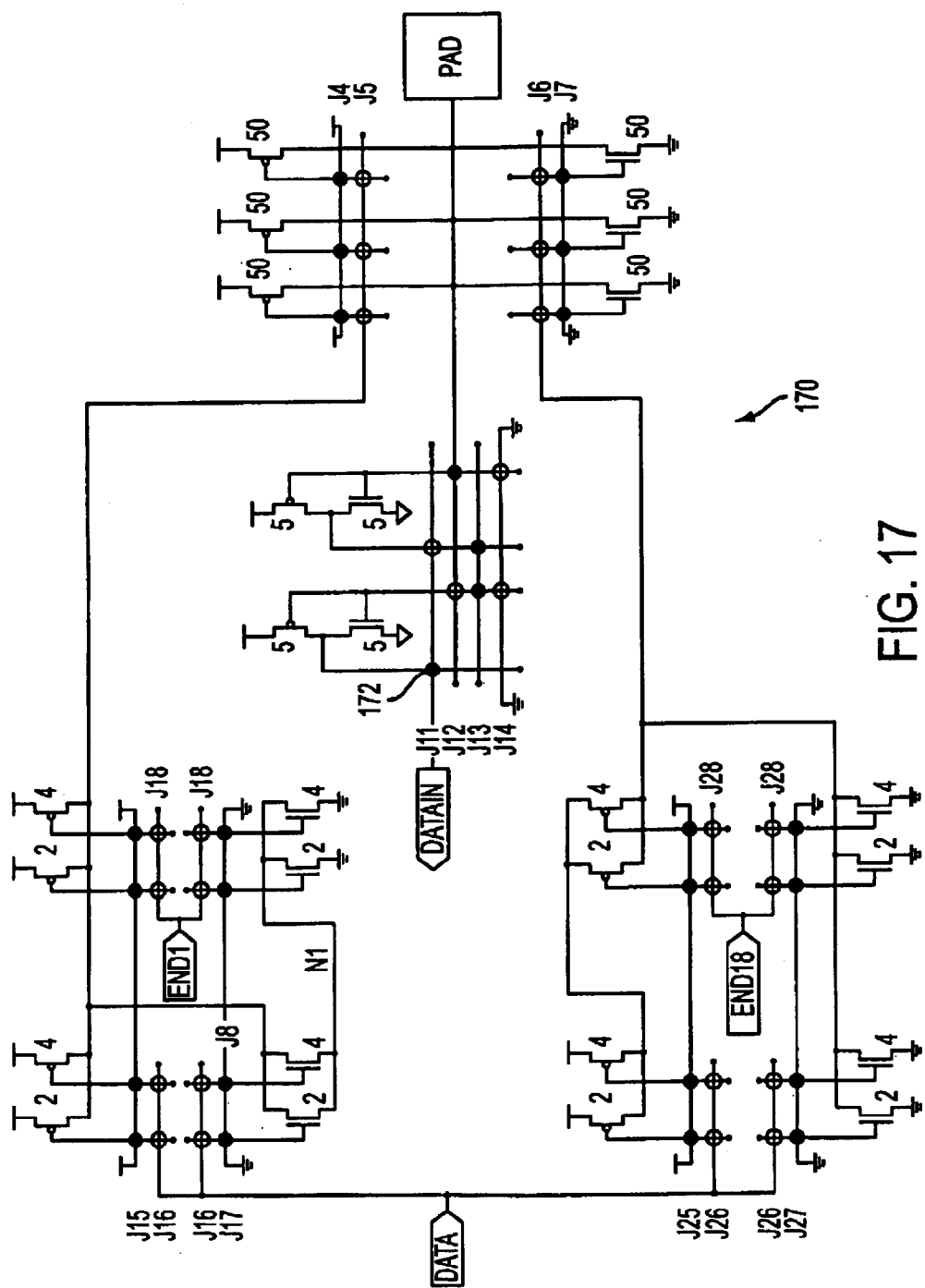
FIG. 17 is a drawing illustration of via customizable I/O customized as input.
Figure 18:
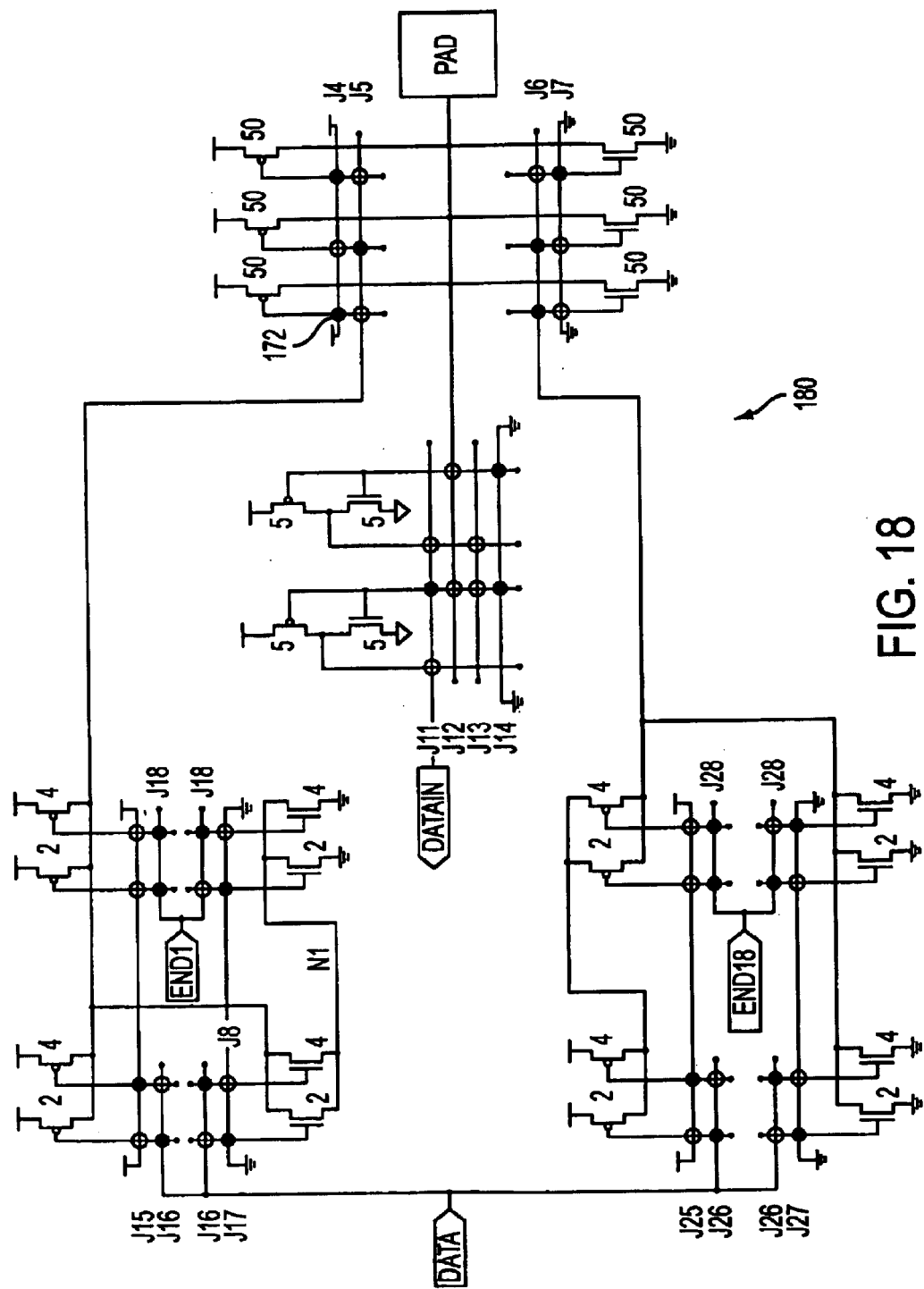
FIG. 18 is a drawing illustration of via customizable I/O customized as output.

Reference is now made to FIGS. 16, 17, and 18 which illustrates another preferred embodiment of the current invention. These figures illustrate via-configurable I/O. Preferably the area I/O of the borderless logic array is configurable I/O. It is advantageous to many users to have flexibility of the I/O configuration, in addition to having flexibility of the logic. It is the purpose of this invention to utilize the same custom mask to configure both the core logic and the I/O. FIG. 16 illustrates a simple via-configurable I/O 160, where the potential vias are marked by a circle 162. Few vias are arranged to connect a line used as a jumper, and mark such as J4 164 to the crossing line, preferably underneath 166 or 167 or 168. Different types of I/Os could be constructed by selecting some of the potential vias. FIG. 17 presents a configuration of the configurable I/O of FIG. 16 as an input cell 170. The selected vias are marked by black filled circle 172. FIG. 18 presents an alternative configuration as output cell 180.

Figure 19:
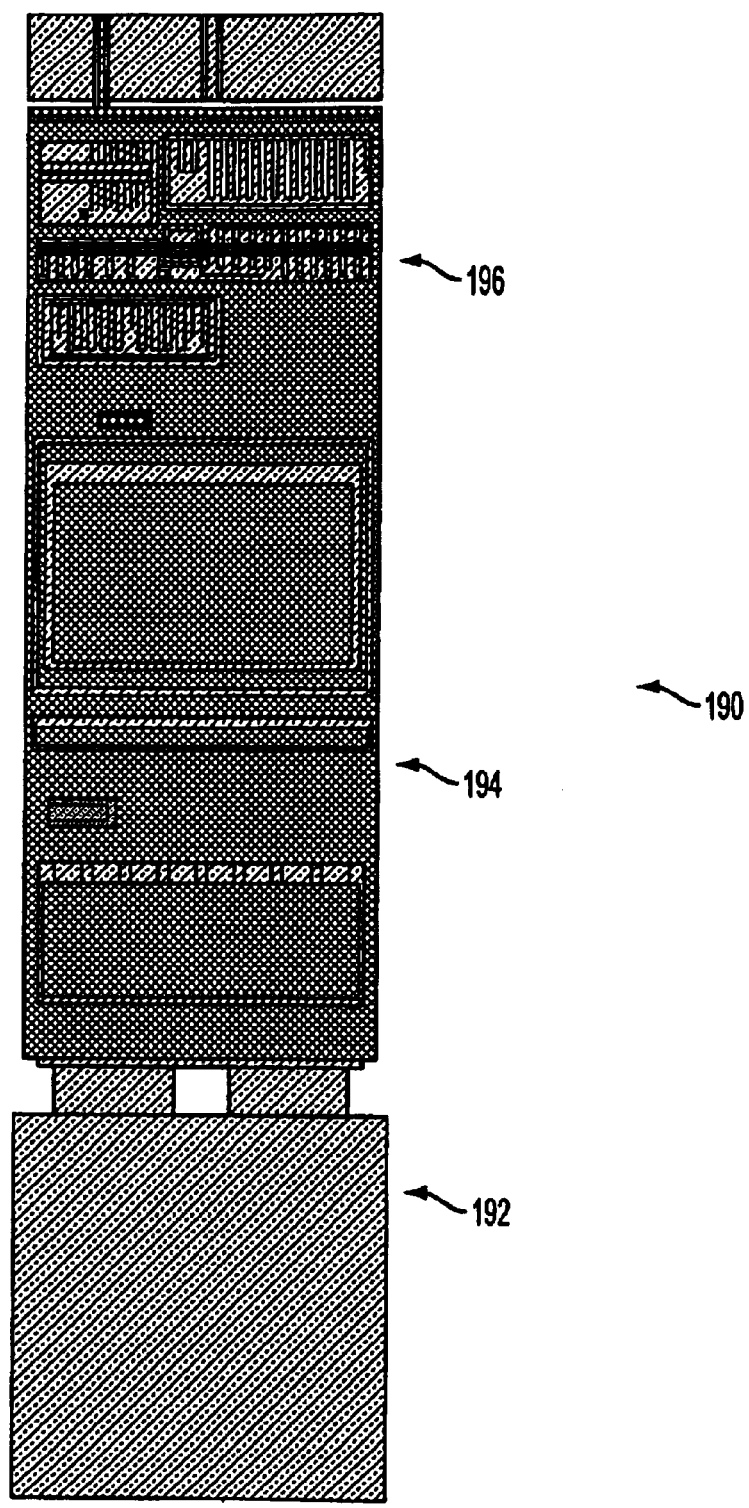
FIG. 19 is a layout drawing illustration of via customizable I/O.

FIG. 19 is a layout drawing illustration of via customizable I/O 190. The I/O comprises the main elements pads 192, high drive I/O section 194 and the I/O logic section 196 comprising the pre-driver circuits.

Figure 20:
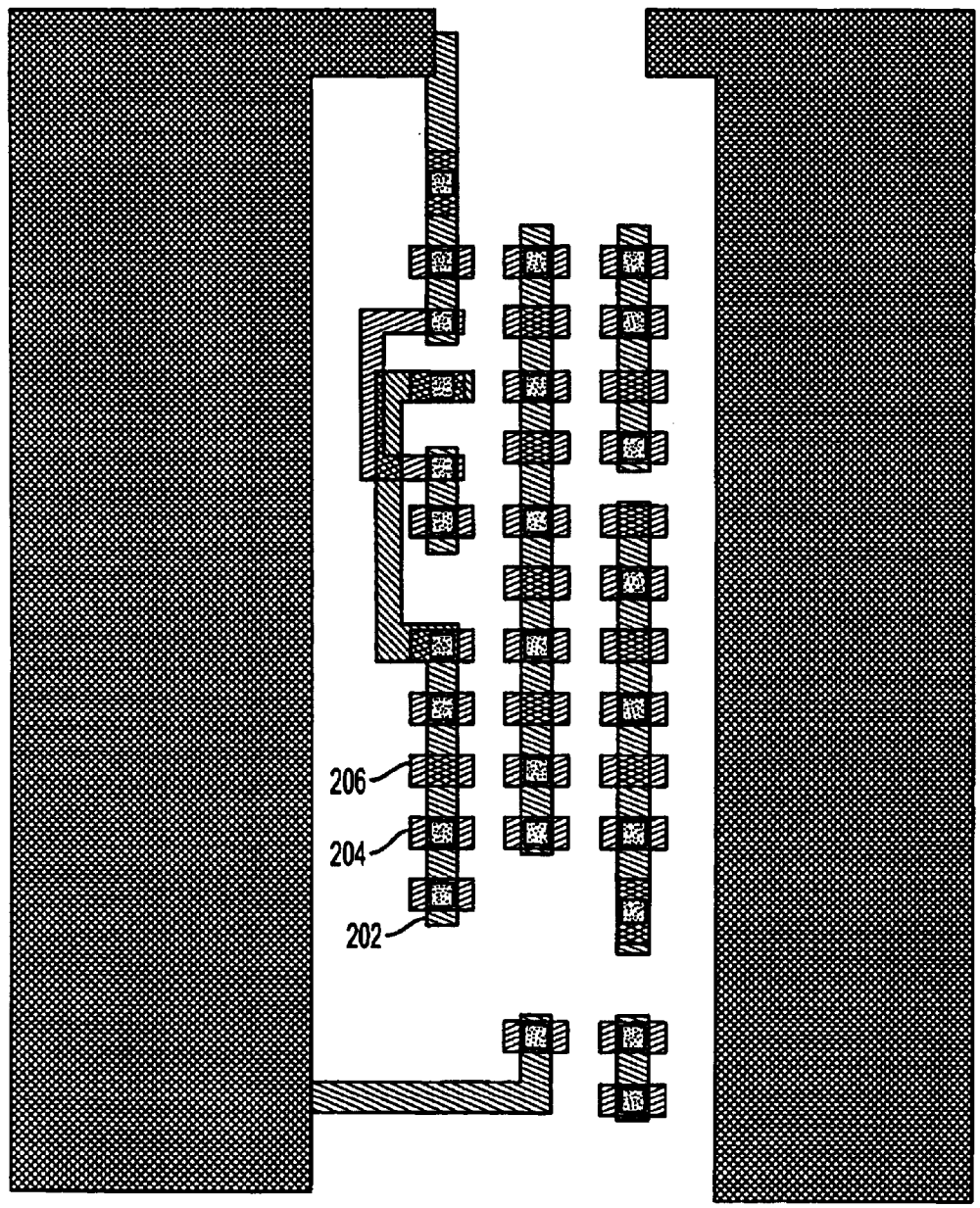
FIG. 20 is a layout drawing illustration of a small section of via customizable I/O.

FIG. 20 is a layout drawing illustration of a small section of the via customizable I/O, illustrating a jumper 202 with an activated via 204 and a not activated via 206.

In another embodiment I/O may be comprised of many input 163, output 165 or pre-driver 161 cells such that most I/O types could be constructed by interconnecting to one or more of these cells by providing additional segments between cells for via programming. It is further contemplated that many more I/O cells 26 exist in each repeating core 28, FIG. 2 than area pads in each repeating core, to allow flexible programming of each repeating core's I/O pads.

Figures 1, 21:
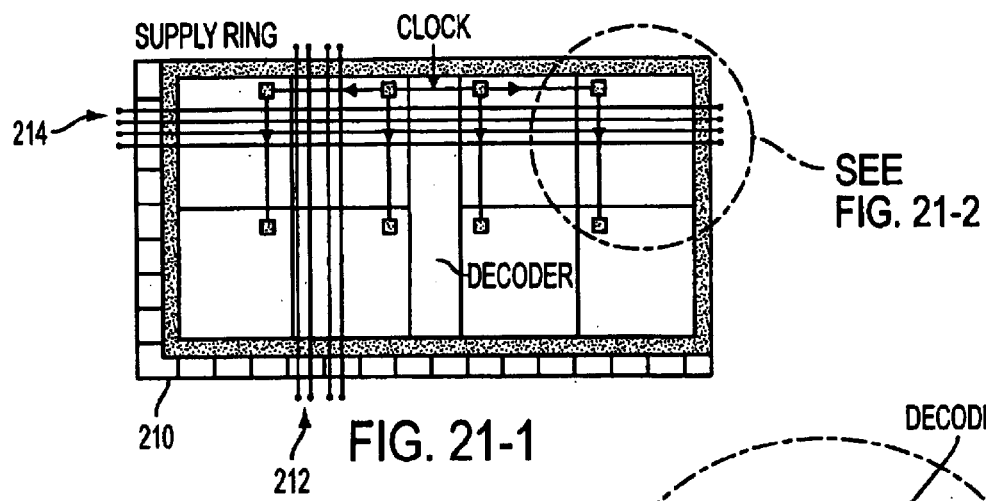
FIG. 21, consisting of FIGS. 21-1, 21-2, and 21-3, is a drawing illustration of very long tracks over a core.
Figures 2, 21:
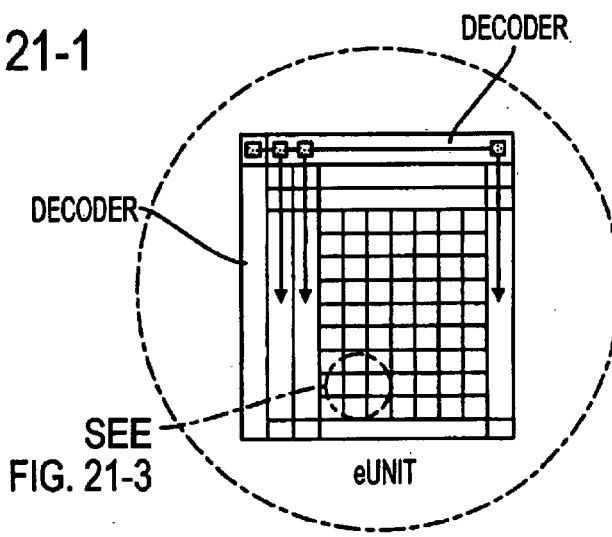
Figures 3, 21:
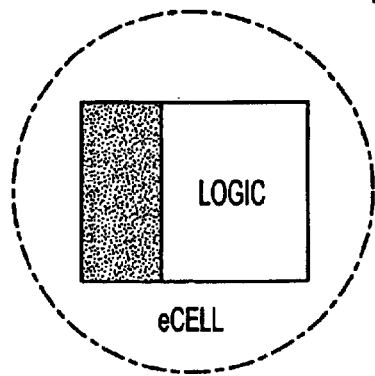

In another embodiment of this current invention additional routing channels, called very long tracks, are introduced. Reference is now made to FIG. 21. FIG. 21 is a drawing illustration of very long tracks 212, 214 across a module 210. The very long tracks could go under or over the local routing fabric 150 to allow segmented routing of more than 4 metal layers. When many modules are tiled together to construct array of logic with over million gates, more than 4 layers of routing might be required. The current invention suggests the use of very long tracks in addition to the short tracks and long tracks described in U.S. Pat. No. 6,331,733. The very long tracks would have very few, or even zero, contacts within the module. The router software could assign the very long tracks to route between logic cells that are very far apart. At every end point or contact point of the very long track, short routing tracks would be used to connect it to the 4-metal routing fabric. This approach allows extension of the segmented routing architecture to as many metal layers as the fabrication process supports. It is further contemplated that very long tracks will include jumpers 154, an example of which is shown in FIG. 15, between each repeating core, to allow for scribing between repeating cores while maintaining reliable use of all segments. In addition, it is contemplated that some of these long lines may be used for power and ground distribution across modules within target dies.

Figure 22:
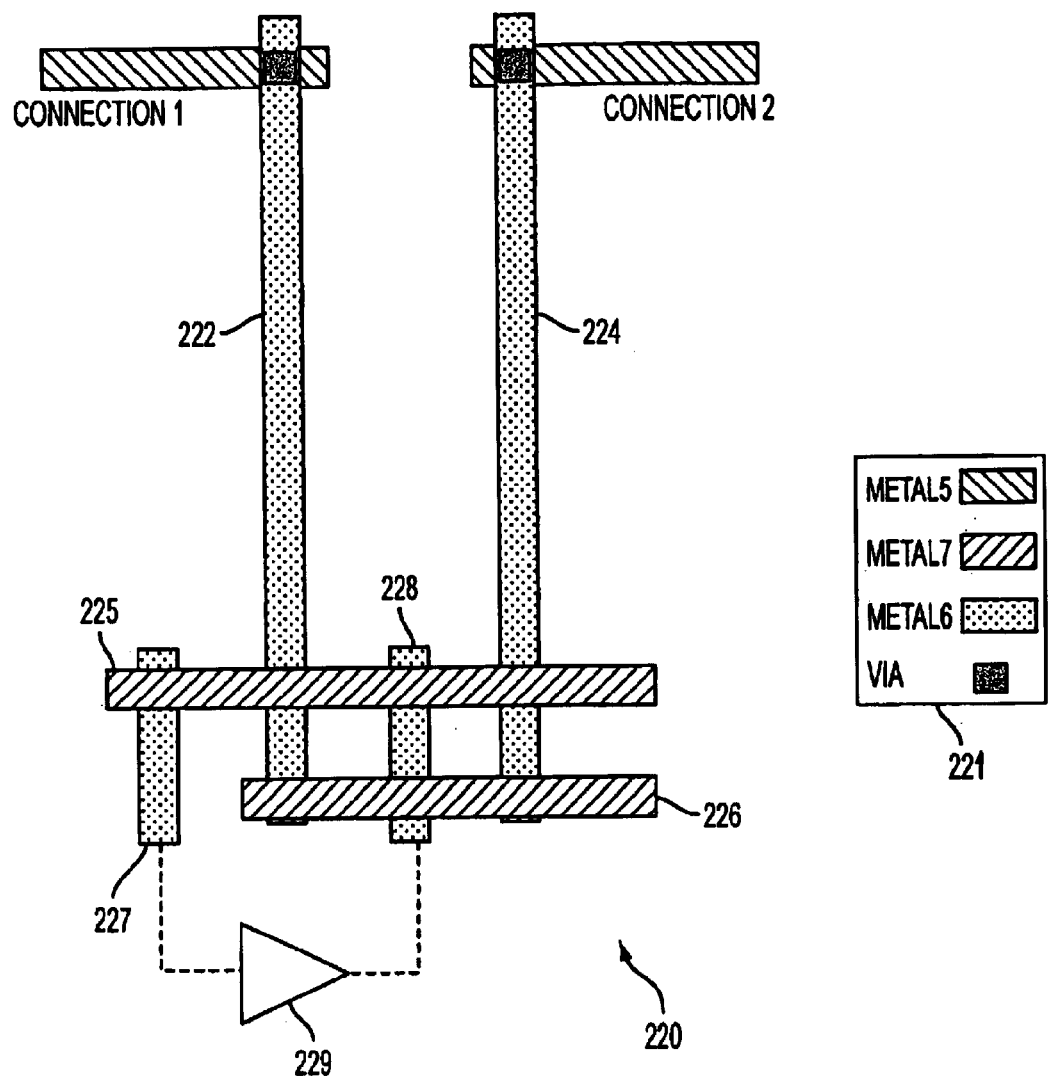
FIG. 22 is a drawing illustration of a configurable buffer structure.

In another embodiment of this current invention a 'scramble box' is proposed for the routing connection between modules 28 or 210. The objective of such 'scramble box' is to reduce cross talk between long lines that run adjacent to each other. By having such 'scramble box' be a part of the generic fabric the reduction of cross talk is provided in the fabric itself rather than by the careful design of the customization layers. Preferably such 'scramble box' would include buffers to farther simplify the customization and redrive signals of long lines. Reference is now made to FIG. 22. FIG. 22 is a drawing illustration of a configurable buffer structure. The 220 illustrates via configurable buffer structure. It includes a buffer 229 that is in the lower layers two Metal 7 jumpers 225, 226 and four Metal 6 connection lines. By selecting two or four vias the structure could be configured for:

(1) Buffer line 222 to line 224;
(2) Buffer line 224 to line 222;
(3) Connect line 222 with line 224 with no buffer and tie off the buffer;
(4) Leave lines 222 and 224 unconnected and tie off the buffer.

Figure 23:
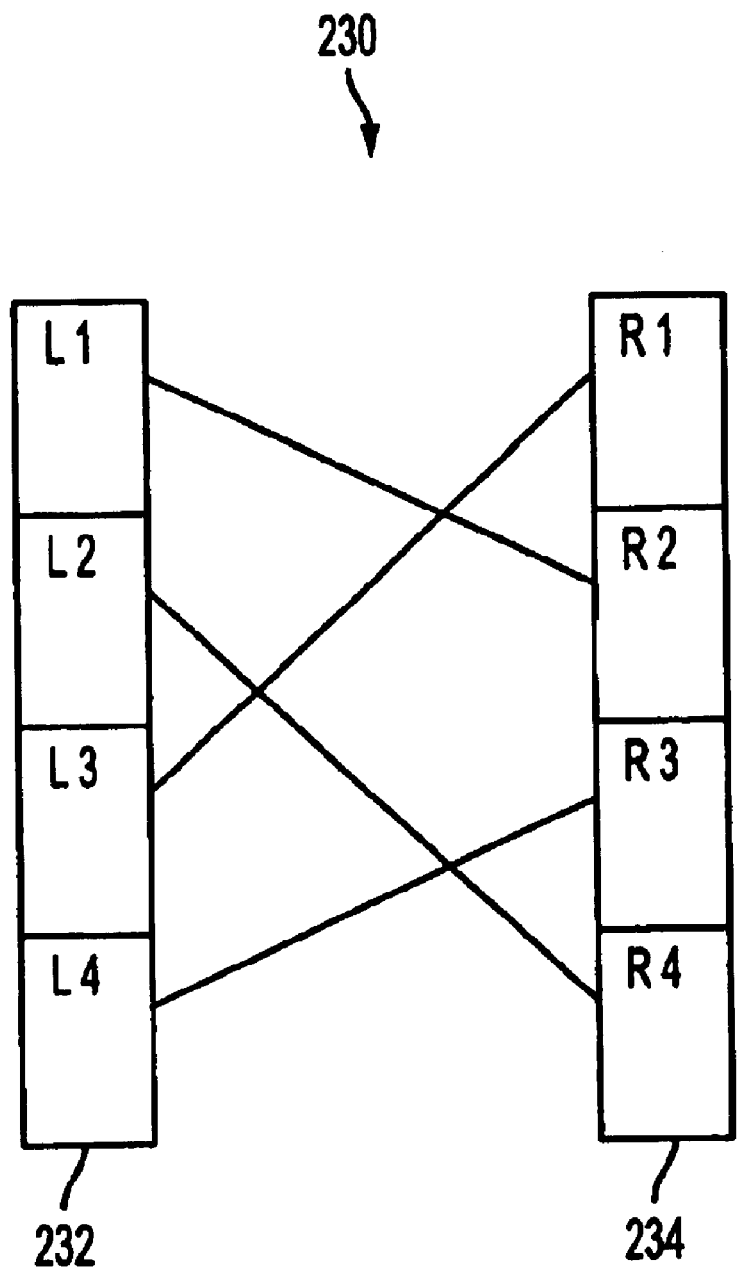
FIG. 23 is a drawing illustration of a simple "scramble box;"

FIG. 23 is a drawing illustration of a simple 'scramble box' function. Four lines are coming into the 'scramble box' 230 on one side 232 and coming out from the other side 234, where each line now has new "neighbors".

Figure 24:
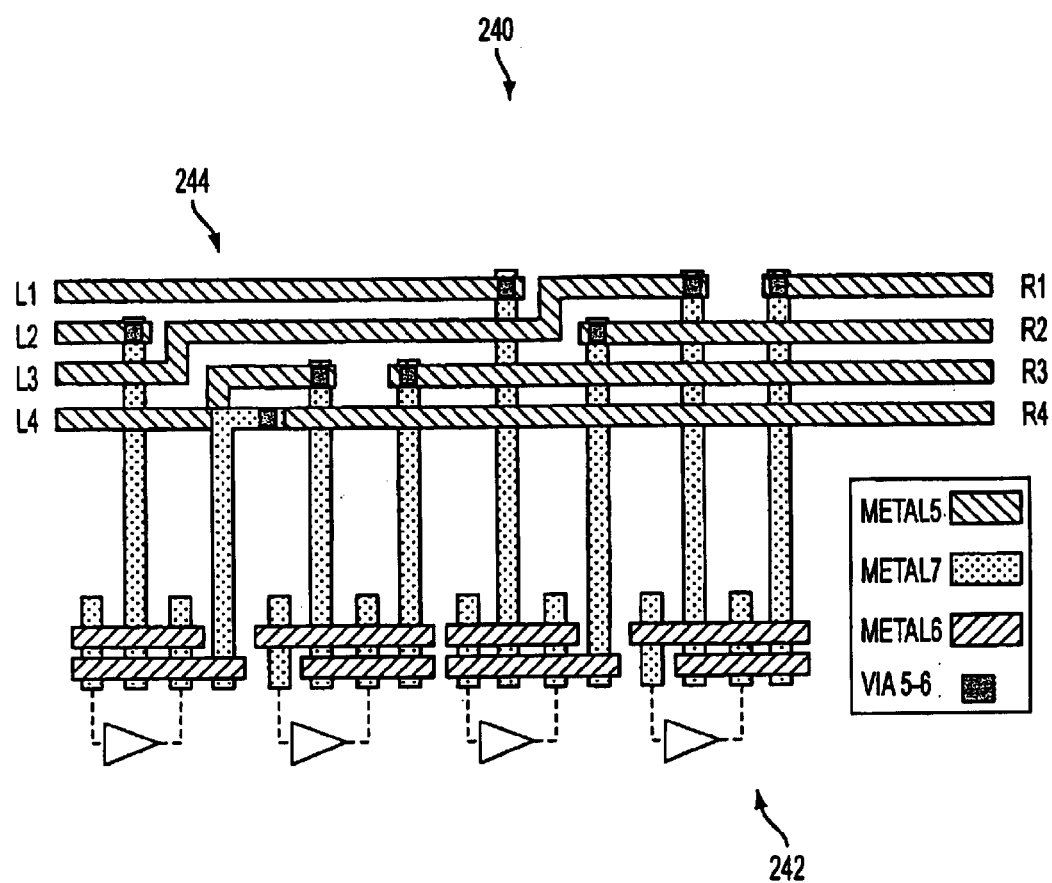
FIG. 24 is a drawing illustration of "scramble box" layout.

FIG. 24 is a drawing illustration of 'scramble box' layout. The four lines 'scramble box' 240 includes a configurable buffers structure 242.

Figure 25:
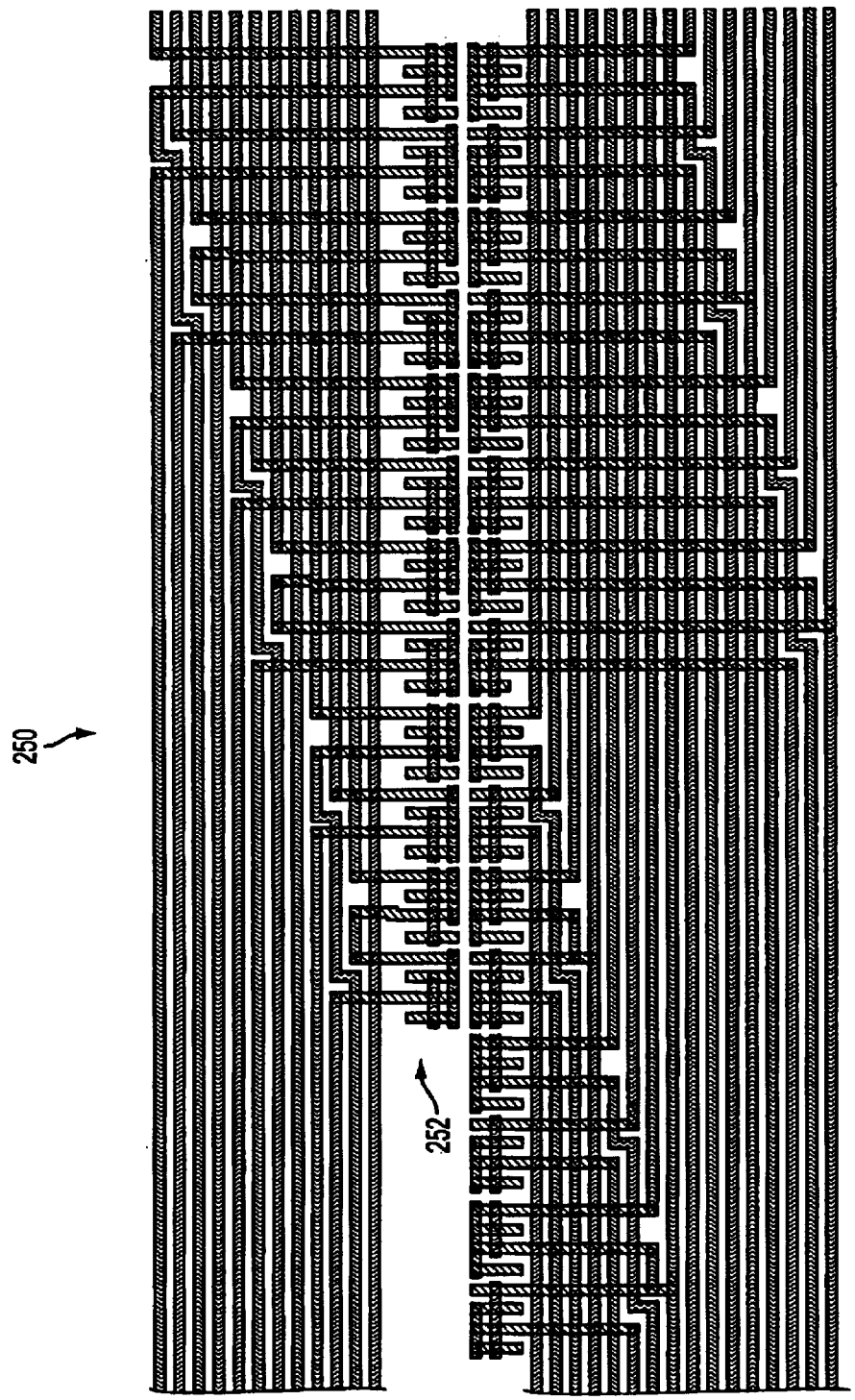
FIG. 25 is a drawing illustration of "scramble box" layout for 24 lines.

FIG. 25 is a drawing illustration of 'scramble box' layout for 28 lines 250. It comprises seven copies of the structure 240 and it includes 28 buffer structure 252.

It will be appreciated by persons skilled in the art that the present invention is not limited to what has been particularly shown and described hereinabove. Rather, the scope of the present invention includes both combinations and sub-combinations of various features described hereinabove as well as modifications and variations which would occur to persons skilled in the art upon reading the foregoing description and which are not in the prior art.

We claim:

1. A semiconductor device comprising:
a borderless logic array;
area I/Os; and
a redistribution layer for redistributing at least some of said area I/Os.

2. A semiconductor device according to claim 1 and wherein at least one pad used to connect said semiconductor device to other devices overlays at least a portion of the logic array or a portion of the area I/Os.

3. A semiconductor device according to claim 1 and also comprising:
a borderless memory array.

4. A semiconductor device according to claim 1 and wherein said logic array comprises:
a module array.

5. A semiconductor device according to claim 1, further comprising interconnections within the logic array, wherein said logic array interconnections comprise metal layers and via layers, and wherein at least one of said metal layers comprises at least one substantially repeating pattern for a portion used for said interconnections.

6. A semiconductor device according to claim 5 and wherein at least two of said metal layers comprise substantially repeating patterns for portions used for said interconnections.

7. A semiconductor device according to claim 5 and wherein at least three of said metal layers comprise substantially repeating patterns for portions used for said interconnections.

8. A semiconductor device according to claim 1 and wherein said area I/Os are positioned in a non-surrounding fashion with respect to said logic array.

9. A semiconductor device according to claim 1 and wherein said logic array comprises a repeating module, and wherein said area I/Os are positioned in a non-surrounding fashion with respect to at least one of said repeating module.

10. A semiconductor device according to claim 1, wherein said logic array comprises a repeating core, and wherein at least one of said area I/Os is a configurable I/O.

11. A semiconductor device according to claim 1 and wherein said borderless logic array is formed by a process that includes a step of positioning said area I/Os in a non-surrounding fashion with respect to said logic array.

12. A semiconductor device according to claim 1 and wherein said logic array comprises a repeating core, and wherein said borderless logic array is formed by a process that includes a step of positioning said area I/Os in a non-surrounding fashion with respect to said logic array.

13. A semiconductor device according to claim 1, wherein said logic array comprises a repeating core, and wherein said borderless logic array is formed by a process that includes a step of positioning said area I/Os within said core, and wherein at least one of said area I/Os is configurable I/O.

14. A semiconductor device as in claim 1, wherein at least one of said area I/Os comprises a configurable I/O.

15. A semiconductor device as in claim 14, wherein said configurable I/O comprises multiple copies of input, output, and pre-output cells, and wherein the semiconductor device further comprises connections between at least one of said input, output, and pre-output cells and area I/O pads to construct an area I/O.

* * * * *